United States Patent
Woodruff et al.

(10) Patent No.: US 11,976,352 B2
(45) Date of Patent: May 7, 2024

(54) METHODS OF VAPOR DEPOSITION OF RUTHENIUM USING AN OXYGEN-FREE CO-REACTANT

(71) Applicant: MERCK PATENT GMBH, Darmstadt (DE)

(72) Inventors: Jacob Woodruff, Lexington, MA (US); Guo Liu, Haverhill, MA (US); Ravindra Kanjolia, North Andover, MA (US)

(73) Assignee: MERCK PATENT GMBH, Darmstadt (DE)

(*) Notice: Subject to any disclaimer, the term of this patent is extended or adjusted under 35 U.S.C. 154(b) by 0 days.

(21) Appl. No.: 16/965,492

(22) PCT Filed: Feb. 7, 2019

(86) PCT No.: PCT/EP2019/053067
§ 371 (c)(1),
(2) Date: Jul. 28, 2020

(87) PCT Pub. No.: WO2019/154945
PCT Pub. Date: Aug. 15, 2019

(65) Prior Publication Data
US 2021/0047725 A1 Feb. 18, 2021

Related U.S. Application Data

(60) Provisional application No. 62/629,361, filed on Feb. 12, 2018.

(51) Int. Cl.
*C23C 16/18* (2006.01)
*C23C 16/455* (2006.01)
*C23C 16/56* (2006.01)

(52) U.S. Cl.
CPC ........ *C23C 16/18* (2013.01); *C23C 16/45527* (2013.01); *C23C 16/56* (2013.01)

(58) Field of Classification Search
CPC ... C23C 16/18; C23C 16/45527; C23C 16/56; C23C 16/45553
See application file for complete search history.

(56) References Cited

U.S. PATENT DOCUMENTS

| | | | |
|---|---|---|---|
| 6,380,080 B2 | 4/2002 | Visokay | |
| 6,503,764 B1 * | 1/2003 | Tseng | H01L 27/10817 257/E21.648 |

(Continued)

FOREIGN PATENT DOCUMENTS

| | | |
|---|---|---|
| JP | 2002212112 A | 7/2002 |
| JP | 2006057112 A | 3/2006 |

(Continued)

OTHER PUBLICATIONS

International Search Report for PCT Application No. PCT/EP2019/053067 dated May 23, 2019.

(Continued)

*Primary Examiner* — Michael G Miller
(74) *Attorney, Agent, or Firm* — Harness Dickey & Pierce P.L.C.

(57) ABSTRACT

Methods of forming ruthenium-containing films by atomic layer deposition and/or chemical vapor deposition are provided. The methods comprise delivering at least one precursor and an oxygen-free co-reactant, such as hydrazine or alkylhydrazine, to a substrate to form a ruthenium-containing film, wherein the at least one precursor corresponds in structure to Formula (I): $(L)Ru(CO)_3$, wherein L is selected from the group consisting of a linear or branched $C_2$-$C_6$-alkenyl and a linear or branched $C_1$-$C_6$-alkyl; and wherein L is optionally substituted with one or more substituents independently selected from the group consisting of $C_2$-$C_6$-

(Continued)

alkenyl, $C_1$-$C_6$-alkyl, alkoxy and $NR^1R^2$; wherein $R^1$ and $R^2$ are independently alkyl or hydrogen; and annealing the ruthenium-containing film under vacuum or in the presence of an inert gas such as Ar, $N_2$, or a reducing gas such as $H_2$ or a combination thereof.

23 Claims, 29 Drawing Sheets

(56) References Cited

U.S. PATENT DOCUMENTS

| | | | |
|---|---|---|---|
| 6,541,067 | B1 | 4/2003 | Marsh et al. |
| 6,800,542 | B2 | 10/2004 | Kim |
| 6,844,261 | B2 | 1/2005 | Marsh et al. |
| 7,211,509 | B1 | 5/2007 | Gopinath et al. |
| 7,238,822 | B2 | 7/2007 | Sakai et al. |
| 7,419,698 | B2 | 9/2008 | Jones |
| 8,357,614 | B2 | 1/2013 | Gatineau |
| 8,753,718 | B2 | 6/2014 | Dussarrat et al. |
| 9,347,133 | B2 | 5/2016 | Park et al. |
| 2002/0129768 | A1* | 9/2002 | Carpenter .......... C30B 25/08 118/715 |
| 2002/0173054 | A1 | 11/2002 | Kim |
| 2003/0036242 | A1 | 2/2003 | Yang |
| 2003/0092262 | A1 | 5/2003 | Marsh et al. |
| 2003/0207540 | A1 | 11/2003 | Ahn et al. |
| 2005/0164466 | A1 | 7/2005 | Zheng et al. |
| 2006/0013955 | A1 | 1/2006 | Senzaki |
| 2006/0145142 | A1 | 7/2006 | Norman |
| 2006/0240190 | A1 | 10/2006 | Sakai et al. |
| 2007/0190684 | A1 | 8/2007 | Jones |
| 2011/0165780 | A1* | 7/2011 | Kanjolia .......... C23C 16/45525 438/785 |
| 2011/0312148 | A1 | 12/2011 | Kim et al. |
| 2013/0146468 | A1* | 6/2013 | Kim .................. C23C 28/02 205/186 |
| 2013/0202794 | A1 | 8/2013 | Dussarrat et al. |
| 2015/0056384 | A1 | 2/2015 | Gatineau et al. |

FOREIGN PATENT DOCUMENTS

| | | |
|---|---|---|
| JP | 2013530304 A | 7/2013 |
| TW | 200540291 A | 12/2005 |
| WO | 2000012777 A1 | 3/2000 |
| WO | 2000012779 A1 | 3/2000 |
| WO | 2001066819 A2 | 9/2001 |
| WO | 2006131751 A1 | 12/2006 |
| WO | 2009015270 A1 | 1/2009 |
| WO | 2009015271 A1 | 1/2009 |
| WO | 2009036045 A1 | 3/2009 |
| WO | 2009036046 A1 | 3/2009 |
| WO | 2009086263 A1 | 7/2009 |
| WO | 2009117583 A2 | 9/2009 |
| WO | 2009143452 A1 | 11/2009 |
| WO | 2009143458 A1 | 11/2009 |
| WO | 2009146423 A1 | 12/2009 |
| WO | 2009155507 A1 | 12/2009 |
| WO | 2009155520 A1 | 12/2009 |
| WO | 2011011299 A1 | 1/2011 |
| WO | 2011017068 A1 | 2/2011 |

OTHER PUBLICATIONS

International Written Opinion for PCT Application No. PCT/EP2019/053067 dated May 23, 2019.
Vasilyev, V. Yu., "Structure, Composition, and Electrical Resistance of Thin Ruthenium Metallic Layers Obtained by Pulsed Chemical Vapor Deposition," Journal of Structural Chemistry, 58(8): 1538-1545 (2017).
Knez, M., et al., "ALD—A Versatile Tool for Nanostructuring," Material Matters, 3.2(28): 1-6 (2008).
Chung, S. H., et al., "Electrical and Structural Properties of Ruthenium Film Growth by Atomic Layer Deposition using Liquid-Phase Ru(CO)3 (C6H8) Precursor," Mater. Res. Soc. Symp. Proc., 990: 127-134 (2007).
Dosanjh, S., et al., "The Development and Applicant of Novel Ru Precursors for Atmospheric Pressure MOVPE Growth of Ru Doped Current Blocking Layers," IEEE 20th International Conference on Indium Phosphide & Related Materials, p. 1-3 (2008).
George, S. M., et al., "Surface Chamistry for Atomic Layer Growth," J. Phys. Chem., 100: 13121-13131 (1996).
Potter, R. J., et al., "Deposition of HfO2, Gd2O3 and prOx by Liquid Injection ALD Techniques," Chem. Vap. Deposition, 11(3): 159-169 (2005).
"O Free Deposition of Ru Metal Films," Insight, Sigma-Aldrich, SAFC Hitech Enabiling Tech., p. 9 (Online) (2008) http://www.safcglobal.com/etcmedialib/docs/SAFC/Bulletin/insight-october2008.Par.0001.File.tmp/insight-october2008.pdf.
International Search Report and Written Opinion for PCT Application No. PCT/US2009/045677 dated Aug. 17, 2009.
Office Action from corresponding Chinese Application No. 2019800098937 dated Jul. 4, 2022.
Office Action from corresponding Japanese Application No. 2020-542894 dated Jan. 31, 2023.
Office Action from corresponding EP Application No. 19704000.9 dated Mar. 1, 2023.

* cited by examiner

METHODS OF VAPOR DEPOSITION OF RUTHENIUM USING AN OXYGEN-FREE CO-REACTANT

CROSS-REFERENCE TO RELATED APPLICATIONS

This patent application is a U.S. national stage application under 35 U.S.C. § 371 of International Patent Application No. PCT/EP2019/053067 filed on 7 Feb. 2019, which claims the benefit of U.S. Provisional Patent Application No. 62/629,361 filed on 12 Feb. 2018. The entire disclosures of each of the above recited applications are incorporated herein by reference.

FIELD

The present invention relates to methods of forming ruthenium (Ru)-containing films by atomic layer deposition (ALD) and/or chemical vapor deposition (CVD).

BACKGROUND

Various precursors are used to form thin films and a variety of deposition techniques have been employed. Such techniques include reactive sputtering, ion-assisted deposition, sol-gel deposition, chemical vapor deposition (CVD) (also known as metalorganic CVD or MOCVD), and atomic layer deposition (also known as atomic layer epitaxy). CVD and ALD processes are increasingly used as they have the advantages of enhanced compositional control, high film uniformity, and effective control of doping. Moreover, CVD and ALD processes provide excellent conformal step coverage on highly non-planar geometries associated with modern microelectronic devices.

CVD is a chemical process whereby precursors are used to form a thin film on a substrate surface. In a typical CVD process, the precursors are passed over the surface of a substrate (e.g., a wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is a chemical method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction chamber. A second precursor or co-reactant is then passed over the substrate surface and reacts with the first precursor, forming a second monolayer of film over the first-formed monolayer of film on the substrate surface. This cycle is repeated to create a film of desired thickness.

Thin films, and in particular thin metal-containing films, have a variety of important applications, such as in nanotechnology and the fabrication of semiconductor devices. Examples of such applications include high-refractive index optical coatings, corrosion-protection coatings, photocatalytic self-cleaning glass coatings, biocompatible coatings, dielectric capacitor layers and gate dielectric insulating films in field-effect transistors (FETs), capacitor electrodes, gate electrodes, adhesive diffusion barriers, and integrated circuits. Dielectric thin films are also used in microelectronics applications, such as the high-K dielectric oxide for dynamic random access memory (DRAM) applications and the ferroelectric perovskites used in infrared detectors and non-volatile ferroelectric random access memories (NV-FeRAMs).

The continual decrease in the size of microelectronic components has increased the need for improved thin film technologies. Further, there is a need for deposition of ruthenium as next generation metal electrodes, caps or liners in logic and memory semiconductor manufacturing. Most existing ruthenium ALD processes use oxygen containing co-reactants to obtain low resistivity metal films deposited at reasonable growth rates. However, oxygen co-reactants undesirably react with underlying films, such as metals and liners, and increase their resistivity. Therefore, a non-oxygen containing co-reactant process for ALD of Ru is needed.

SUMMARY OF THE INVENTION

Thus, provided herein are new methods of forming a ruthenium-containing film by atomic layer deposition and/or chemical vapor deposition. In some embodiments, the method may comprise delivering at least one precursor and an oxygen-free co-reactant to a substrate to form the ruthenium-containing film, wherein the at least one precursor corresponds in structure to Formula I:

$$(L)Ru(CO)_3 \qquad \text{(Formula I)}$$

wherein: L is selected from the group consisting of a linear or branched $C_2$-$C_6$-alkenyl and a linear or branched $C_{1-6}$-alkyl; and wherein L is optionally substituted with one or more substituents independently selected from the group consisting of $C_2$-$C_6$-alkenyl, $C_1$-$C_6$-alkyl, alkoxy and $NR^1R^2$; wherein $R^1$ and $R^2$ are independently alkyl or hydrogen; and annealing the ruthenium-containing film under vacuum or in the presence of an inert gas such as Ar, $N_2$, or a reducing gas such as $H_2$ or a combination thereof.

In some embodiments, the oxygen-free co-reactant used in the ALD and/or CVD process may be hydrazine or alkylhydrazine.

In further embodiments, one or more precursors that may be delivered to the substrate are:
($\eta^4$-buta-1,3-diene)tricarbonylruthenium;
($\eta^4$-2,3-dimethylbuta-1,3-diene)tricarbonylruthenium, also known as (DMBD)Ru(CO)$_3$;
and ($\eta^4$-2-methylbuta-1,3-diene)tricarbonylruthenium.

In other embodiments, methods of lowering the resistivity of a ruthenium-containing film are provided. The method may comprise annealing the ruthenium-containing film under vacuum, or in the presence of Ar, $N_2$, $H_2$ or a combination thereof at a temperature between about 300° C.-450° C. to form an annealed ruthenium-containing film having a resistivity at least about 10% less than the ruthenium-containing film. The ruthenium-containing film may be formed from ALD and/or CVD comprising delivering one or more of:
($\eta^4$-buta-1,3-diene)tricarbonylruthenium;
($\eta^4$-2,3-dimethylbuta-1,3-diene)tricarbonylruthenium; and
($\eta^4$-2-methylbuta-1,3-diene)tricarbonylruthenium;
and an oxygen-free co-reactant to a substrate.

Other embodiments, including particular aspects of the embodiments summarized above, will be evident from the detailed description that follows.

BRIEF DESCRIPTION OF THE DRAWINGS

Comparative

Comparative

DETAILED DESCRIPTION

Figure 1:
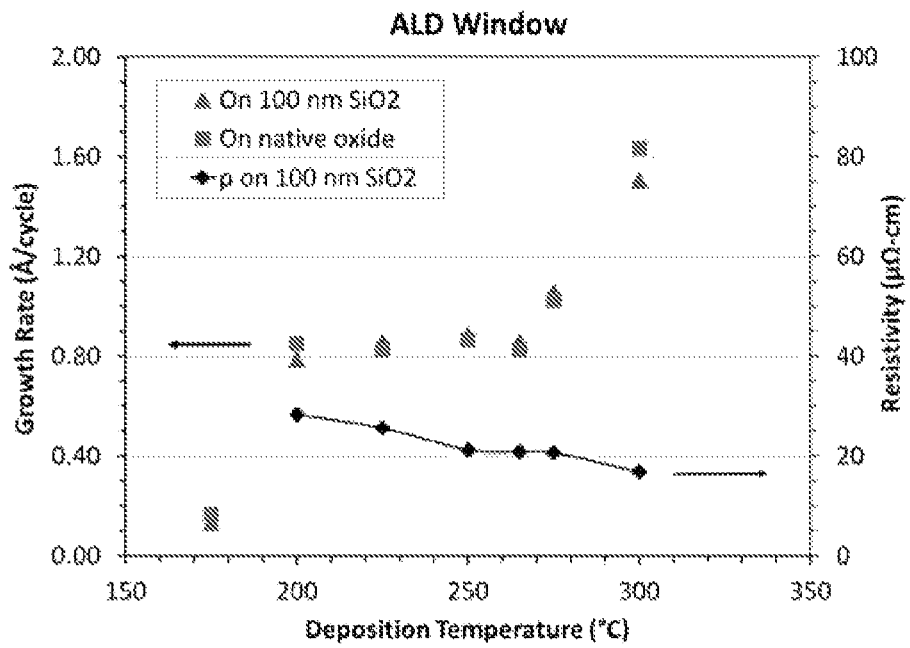
FIG. 1 is a graphical representation of ruthenium film growth rate (Å/cycle) vs. deposition temperature (° C.) vs. resistivity (μΩ-cm) for ALD of ruthenium using oxygen and (DMBD)Ru(CO)$_3$.

Before describing several exemplary embodiments of the present technology, it is to be understood that the technology is not limited to the details of construction or process steps set forth in the following description. The present technology is capable of other embodiments and of being practiced or being carried out in various ways.

The inventors have discovered processes including two steps to improve ruthenium deposition and films formed therefrom. An ALD process may include depositing an intermediate ruthenium film using a precursor of Formula I as described herein and an oxygen-free co-reactant at lower temperatures, for example ≤250° C., within the ALD window, and then reducing the intermediate film by annealing at a higher temperature, for example at 300-400° C. under vacuum, in hydrogen and/or argon, or nitrogen. The oxygen-free ALD processes described herein were discovered to provide a high growth rate of ruthenium films, low impurities, low resistivity and a substantially uniform thickness compared to current ALD processes for forming ruthenium thin films, including current ALD processes using oxygen to form ruthenium thin films.

Definitions

For purposes of this invention and the claims hereto, the numbering scheme for the Periodic Table Groups is according to the IUPAC Periodic Table of Elements.

The term "and/or" as used in a phrase such as "A and/or B" herein is intended to include "A and B", "A or B", "A", and "B".

The terms "substituent", "radical", "group", and "moiety" may be used interchangeably.

As used herein, the terms "metal-containing complex" (or more simply, "complex") and "precursor" are used interchangeably and refer to a metal-containing molecule or compound which can be used to prepare a metal-containing film by a vapor deposition process such as, for example, ALD or CVD. The metal-containing complex may be deposited on, adsorbed to, decomposed on, delivered to, and/or passed over a substrate or surface thereof, as to form a metal-containing film.

As used herein, the term "metal-containing film" includes not only an elemental metal film as more fully defined below, but also a film which includes a metal along with one or more elements, for example a metal nitride film, metal silicide film, a metal carbide film and the like. As used herein, the terms "elemental metal film" and "pure metal film" are used interchangeably and refer to a film which consists of, or consists essentially of, pure metal. For example, the elemental metal film may include 100% pure metal or the elemental metal film may include at least about 70%, at least about 80%, at least about 90%, at least about 95%, at least about 96%, at least about 97%, at least about 98%, at least about 99%, at least about 99.9%, or at least about 99.99% pure metal along with one or more impurities. Unless context dictates otherwise, the term "metal film" shall be interpreted to mean an elemental metal film.

As used herein, the term "vapor deposition process" is used to refer to any type of vapor deposition technique, including but not limited to, CVD and ALD. In various embodiments, CVD may take the form of conventional (i.e., continuous flow) CVD, liquid injection CVD, or photo-assisted CVD. CVD may also take the form of a pulsed technique, i.e., pulsed CVD. ALD is used to form a metal-containing film by vaporizing and/or passing at least one metal complex disclosed herein over a substrate surface. For conventional ALD processes see, for example, George S. M., et al. *J. Phys. Chem.*, 1996, 100, 13121-13131. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

The term "alkyl" refers to a saturated hydrocarbon chain of 1 to about 8 carbon atoms in length, such as, but not limited to, methyl, ethyl, propyl and butyl. The alkyl group may be straight-chain or branched-chain. For example, as used herein, propyl encompasses both n-propyl and iso-propyl; butyl encompasses n-butyl, sec-butyl, iso-butyl and tert-butyl. Further, as used herein, "Me" refers to methyl, and "Et" refers to ethyl.

The term "alkenyl" refers to an unsaturated hydrocarbon chain of 2 to about 6 carbon atoms in length, containing one or more double bonds. Examples include, without limitation, ethenyl, propenyl, butenyl, pentenyl and hexenyl.

The term "dienyl" refers to a hydrocarbon group containing two double bonds. A dienyl group may be linear, branched, or cyclic. Further, there are unconjugated dienyl groups which have double bonds separated by two or more single bonds; conjugated dienyl groups which have double bonds separated by one single bond; and cumulated dienyl groups which have double bonds sharing a common atom.

The term "alkoxy" (alone or in combination with another term(s)) refers to a substituent, i.e., —O-alkyl. Examples of such a substituent include methoxy (—O—$CH_3$), ethoxy, etc. The alkyl portion may be straight-chain or branched-chain. For example, as used herein, propoxy encompasses both n-propoxy and iso-propoxy; butoxy encompasses n-butoxy, iso-butoxy, sec-butoxy, and tert-butoxy.

Precursors

As stated above, methods of forming a ruthenium-containing film by atomic layer deposition are provided herein. In one embodiment, the method may comprise delivering at least one precursor corresponding to Formula I and an oxygen-free co-reactant to a substrate to form a ruthenium-containing film, and then annealing the ruthenium-containing film under vacuum or in the presence of Ar, $N_2$, $H_2$ or a combination thereof. In addition to annealing or instead of annealing, the ruthenium-containing film can also be plasma treated, for example, to densify and/or reduce contamination.

The at least one precursor corresponds in structure to the following Formula I:

$$(L)Ru(CO)_3 \qquad \text{(Formula I)}$$

wherein: L is selected from the group consisting of a linear or branched $C_2$-$C_6$-alkenyl and a linear or branched $C_1$-$C_6$-alkyl; and wherein L is optionally substituted with one or more substituents independently selected from the group consisting of $C_2$-$C_6$-alkenyl, $C_1$-$C_6$-alkyl, alkoxy and $NR^1R^2$; wherein $R^1$ and $R^2$ are independently alkyl or hydrogen.

In one embodiment, L is a linear or branched dienyl-containing moiety. Examples of such linear or branched dienyl-containing moieties include butadienyl, pentadienyl, hexadienyl, heptadienyl and octadienyl. In a further embodiment, the linear or branched dienyl-containing moiety is a 1,3-dienyl-containing moiety.

In another embodiment, L is substituted with one or more substituents such as $C_2$-$C_6$-alkenyl, $C_1$-$C_6$-alkyl, alkoxy and $NR^1R^2$, where $R^1$ and $R^2$ are as defined above. In a particular embodiment, L is a dienyl-containing moiety and substituted with one or more substituents such as $C_2$-$C_6$-alkenyl, $C_1$-$C_6$-alkyl, alkoxy and $NR^1R^2$, where $R^1$ and $R^2$ are as defined above.

In one embodiment, L may be substituted with one or more $C_1$-$C_6$-alkyl groups, such as, but not limited to, methyl, ethyl, propyl, butyl or any combination thereof.

Examples of the at least one precursor include, without limitation:

($\eta^4$-buta-1,3-diene)tricarbonylruthenium, also known as $(BD)Ru(CO)_3$;

($\eta^4$-2,3-dimethylbuta-1,3-diene)tricarbonylruthenium,
also known as (DMBD)Ru(CO)$_3$;
and ($\eta^4$-2-methylbuta-1,3-diene)tricarbonylruthenium.

In some embodiments, the at least one precursor may be dissolved in a suitable solvent such as a hydrocarbon or an amine solvent to facilitate the vapor deposition process. Appropriate hydrocarbon solvents include, but are not limited to, aliphatic hydrocarbons, such as hexane, heptane and nonane; aromatic hydrocarbons, such as toluene and xylene; and aliphatic and cyclic ethers, such as diglyme, triglyme, and tetraglyme. Examples of appropriate amine solvents include, without limitation, octylamine and N,N-dimethyldodecylamine. For example, the at least one precursor may be dissolved in toluene to yield a solution with a concentration from about 0.05 M to about 1 M.

In alternative embodiments, the at least one precursor may be delivered "neat" (undiluted by a carrier gas) to a substrate surface.

Thus, the precursors disclosed herein utilized in these methods may be liquid, solid, or gaseous. Typically, the ruthenium precursors are liquids or solids at ambient temperatures with a vapor pressure sufficient to allow for consistent transport of the vapor to the process chamber.

Oxygen-Free Co-Reactants

Typically, ruthenium precursors require an oxidative environment (such as air, O$_2$, ozone or water) to deposit ruthenium films by ALD. However, it has been discovered ruthenium films can be formed by ALD using the ruthenium-containing precursors described herein and a non-oxygen co-reactant followed by an annealing step to achieve a high growth rate and films having low impurities and low resistivity without the damaging reaction of oxygen co-reactants with the underlying substrate or a part of the underlying substrate. Therefore, in one embodiment, the ALD process described herein is an oxygen-free ALD process. That is to say, the ALD process may be performed or carried out in an oxygen-free environment. For example, a non-oxygen co-reactant used herein may comprise substantially of a gaseous material such as hydrogen, hydrogen plasma, ammonia, hydrazine, alkylhydrazine, silane, borane or any combination thereof. In a particular embodiment, the non-oxygen co-reactant is hydrazine or alkylhydrazine. In various aspects, the alkylhydrazine may be a $C_1$-$C_8$-alkylhydrazine, a $C_1$-$C_4$-alkylhydrazine, or a $C_1$-$C_2$-alkylhydrazine. For example, the alkyl hydrazine may be methylhydrazine, ethylhydrazine, propylhydrazine, or butylhydrazine (including tertiary-butylhydrazine).

Substrates

The ruthenium films described herein can be deposited on a variety of substrates. For example, ruthenium complexes as disclosed herein may be delivered to, passed over, or deposited on a variety of substrates or surfaces thereof such as, but not limited to, silicon, crystalline silicon, Si(100), Si(111), silicon oxide, glass, strained silicon, silicon on insulator (SOI), doped silicon or silicon oxide(s) (e.g., carbon doped silicon oxides), silicon nitride, germanium, gallium arsenide, tantalum, tantalum nitride, aluminum, aluminum oxide, copper, ruthenium, titanium, titanium nitride, tungsten, tungsten nitride, is tungsten carbonitride (WCN), and any number of other substrates commonly encountered in nanoscale device fabrication processes (e.g., semiconductor fabrication processes). In any embodiment, the substrate may comprise one or more layers. For example, the substrate may comprise a liner (e.g., tungsten carbonitride, aluminum oxide) present on a base layer (e.g., silicon oxide). As will be appreciated by those of skill in the art, substrates may be exposed to a pretreatment process to polish, etch, reduce, oxidize, hydroxylate, anneal and/or bake the substrate surface. In one or more embodiments, the substrate surface contains a hydrogen-terminated surface.

ALD & CVD Types and Conditions

The ALD and/or CVD methods provided herein encompass various types of ALD and/CVD processes such as, but not limited to, continuous or pulsed injection processes, liquid injection processes, photo-assisted processes, plasma-assisted, and plasma-enhanced processes.

In some embodiments, conventional or pulsed CVD is used to form a metal-containing film by vaporizing and/or passing the at least one metal complex over a substrate surface. For conventional CVD processes see, for example Smith, Donald (1995). *Thin-Film Deposition: Principles and Practice*. McGraw-Hill.

In other embodiments, photo-assisted CVD is used to form a metal-containing film by vaporizing and/or passing at least one metal complex disclosed herein over a substrate surface.

In some embodiments, conventional (i.e., pulsed injection) ALD is used to form a ruthenium-containing film by vaporizing and/or passing at least one ruthenium complex disclosed herein over a substrate surface. For conventional ALD processes see, for example, George S. M., et al. *J. Phys. Chem.*, 1996, 100, 13121-13131.

In other embodiments, liquid injection ALD is used to form a ruthenium-containing film by vaporizing and/or passing at least one precursor disclosed herein over a substrate surface, wherein the at least one precursor is delivered to the reaction chamber by direct liquid injection as opposed to vapor draw by a bubbler. For liquid injection ALD processes see, for example, Potter R. J., et al., *Chem. Vap. Deposition*, 2005, 11(3), 159-169.

In other embodiments, photo-assisted ALD is used to form a ruthenium-containing film by vaporizing and/or passing at least one precursor disclosed herein over a substrate surface. For photo-assisted ALD processes see, for example, U.S. Pat. No. 4,581,249.

In other embodiments, plasma-assisted or plasma-enhanced ALD is used to form a ruthenium-containing film by vaporizing and/or passing at least one precursor disclosed herein over a substrate surface.

In further embodiments, a method of forming a ruthenium-containing film on a substrate surface comprises: during an ALD process, exposing a substrate to a vapor phase ruthenium complex according to one or more of the embodiments described herein, such that a layer is formed on the surface comprising the ruthenium complex bound to the surface by the ruthenium center; during an ALD process, exposing the substrate having bound ruthenium complex with a co-reactant such that an exchange reaction occurs between the bound ruthenium complex and co-reactant, thereby dissociating the bound ruthenium complex and producing a first layer of elemental ruthenium on the surface of the substrate; and sequentially repeating the ALD process and the treatment.

The reaction time, temperature and pressure for the ALD process are selected to create a ruthenium-surface interaction and achieve a layer on the surface of the substrate. The reaction conditions for the ALD reaction will be selected based on the properties of the ruthenium complex. The deposition can be carried out at atmospheric pressure but is more commonly carried out at a reduced pressure. The vapor pressure of the metal complex should be high enough to be practical in such applications. The substrate temperature should be low enough to keep the bonds between the ruthenium atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on various parameters, including the particular ruthenium complex used and the pressure. In some embodiments, the substrate temperature may be from about 200° C. to about 350° C., preferably from about 200° C. to about 250° C.

The properties of a specific ruthenium complex for use in the ALD deposition methods disclosed herein can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

A ruthenium complex for use in the deposition methods will have all of the requirements for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Examples of ALD growth conditions for the ruthenium complexes disclosed herein include, but are not limited to:
(1) Substrate temperature: 200-300° C.
(2) Evaporator temperature (metal precursor temperature): 20-70° C.
(3) Reactor pressure: 0.01-10 Torr
(4) Argon or nitrogen carrier gas flow rate: 0-100 sccm
(5) Reactive gas (co-reactant) pulse time: 0.01-1 sec. Pulse sequence (metal complex/purge/reactive gas/purge): will vary according to chamber size
(6) Number of cycles: will vary according to desired film thickness.

In some embodiments, conventional (i.e. pulsed injection) ALD is performed using at least one ruthenium precursor described herein and an oxygen-free co-reactant and the ruthenium-containing film may be grown at a growth rate of 0.2-1 Å/cycle based on XRF ruthenium thickness at 200-250° C. depending on the deposition temperature and pressure.

In further embodiments, the methods described herein may be performed under conditions to provide conformal growth, for example, for a liner. As used herein, the term "conformal growth" refers to a deposition process wherein a film is deposited with substantially the same thickness along one or more of a bottom surface, a sidewall, an upper corner, and outside a feature. "Conformal growth" is also intended to encompass some variations in film thickness, e.g., the film may be thicker outside a feature and/or near a top or upper portion of the feature compared to the bottom or lower portion of the feature.

The conformal growth cycle may comprise delivering a ruthenium-containing complex, a purge gas and a co-reactant to a substrate under conformal conditions such that conformal growth occurs. Conformal conditions include, but are not limited to temperature (e.g., of substrate, ruthenium-containing complex, purge gas, co-reactant, etc.), pressure (e.g., during delivery of ruthenium-containing complex, purge gas, co-reactant, etc.), amount of ruthenium-containing complex and/or co-reactant delivered, length of purge time and/or amount of purge gas delivered. In various aspects, the substrate may comprise one or more features where conformal growth may occur.

Additionally or alternatively, under certain conditions, the film can be grown from the bottom of a feature, also known as "bottom-up-fill," which means that material is deposited in the bottom or lower portion of a feature (about 1.0% of the feature starting from the bottom of the feature, or about 20% of the feature starting from the bottom of the feature, or about 50% of the feature starting from the bottom of the feature) and substantially no material may be deposited outside the feature or at the top or upper portion of the feature. The "bottom" or "lower portion" of a feature is intended to encompass about 75% of the depth of the feature starting from the bottom of the feature, e.g., about 70% of the depth of the feature, about 60% of the depth of the feature, about 50% of the depth of the feature, about 40% of the depth of the feature, about 30% of the depth of the feature, about 20% of the depth of the feature, etc. The "top" or "upper portion" of a feature is intended to encompass the upper about 25% of the depth of the feature starting from the top of the feature, e.g., about 20% of the depth of the feature, about 10% of the depth of the feature, about 5.0% of the depth of the feature, etc. The "outside" of the feature is intended to encompass an area about 0.10 nm to about 10 mm in any direction from the opening of the feature.

In various aspects, the feature may be a via, a trench, contact, dual damascene, etc. A feature may have a non-uniform width, also known as a "re-entrant feature," or a feature may have substantially uniform width.

In one or more embodiments, a ruthenium-containing film grown following the methods described herein may have substantially no voids and/or hollow seams.

Annealing

As-deposited ruthenium films from oxygen-free ALD process using hydrazine may contain about 6-10 at % nitrogen and have high resistivity at least in the deposition temperature range from 150° C. to 300° C. Following deposition the resultant films can be then annealed at higher temperatures. The annealing step helps to provide a quality ruthenium film having low impurities and low resistivity.

Therefore, in some embodiments, the ruthenium-containing film may be annealed under vacuum, or in the presence of an inert gas such as Ar or $N_2$, or a reducing agent such as $H_2$, or a combination thereof such as, for example, 5% $H_2$ in Ar. Without being bound by theory, the annealing step may remove incorporated nitrogen to reduce the resistivity and to further improve film quality by densification at elevated temperatures. Therefore, in some embodiments the post-annealed ruthenium-containing film comprises substantially no nitrogen (~0 at %) or below the detection limit of the XPS technique.

Additionally, in some embodiments, the ruthenium-containing film may be annealed at about 300° C. to about 500° C. under vacuum, or in the presence of Ar, $N_2$, $H_2$, or a combination thereof such as 5% $H_2$ in Ar.

In a particular embodiment, the ruthenium-containing film may be annealed at about 400° C. under vacuum, or in the presence of Ar, $N_2$, $H_2$, or a combination thereof such as 5% $H_2$ in Ar.

Plasma Treatment

Additionally or alternatively, following deposition the ruthenium-containing film may be plasma treated which may help to reduce resistivity. Plasma treatment may be done in addition to or instead of the annealing step. Therefore, in further embodiments a method of forming a ruthenium-containing film by ALD, CVD, or a combination of ALD and CVD is provided where the method comprises:

delivering at least one precursor and an oxygen-free co-reactant to a substrate to form the ruthenium-containing film, wherein the at least one precursor corresponds in structure to Formula I:

(L)Ru(CO)$_3$     (Formula I)

wherein L is selected from the group consisting of a linear or branched $C_2$-$C_6$-alkenyl and a linear or branched $C_1$-$C_6$-alkyl; and wherein L is optionally substituted with one or more substituents independently selected from the group consisting of $C_2$-$C_6$-alkenyl, $C_1$-$C_6$-alkyl, alkoxy and $NR^1R^2$; wherein $R^1$ and $R^2$ are independently alkyl or hydrogen; and annealing the ruthenium-containing film under vacuum or in the presence of Ar, $N_2$, $H_2$ or a combination thereof; and/or plasma treating the ruthenium-containing film.

Resistance

The ruthenium-containing films formed from the methods described herein have a low resistivity. In some embodiments, the ruthenium-containing film has a resistance of about 10 μΩ-cm, about 15 μΩ-cm, about 20 μΩ-cm, about 25 μΩ-cm, about 30 μΩ-cm, about 40 μΩ-cm, about 45 μΩ-cm, about 50 μΩ-cm, about 55 μΩ-cm, or about 30 μΩ-cm to about 65 μΩ-cm. Additionally or alternatively, the ruthenium-containing film may have a resistance of about 10 μΩ-cm to about 80 μΩ-cm, about 15 μΩ-cm to about 60 μΩ-cm, about 20 μΩ-cm to about 40 μΩ-cm, or preferably about 10 μΩ-cm to about 30 μΩ-cm.

The resistance measurements noted above may be achieved in ruthenium-containing films prepared by the methods described herein having a thickness of about 1 nm to about 20 nm, about 1 nm to about 15 nm, about 2 nm to about 15 nm, or about 3 nm to about 20 nm measured by XRF.

In further embodiments, methods are provided herein of lowering the resistivity of a ruthenium-containing film. The methods may comprise annealing the ruthenium-containing film under vacuum, or in the presence of an inert gas such as Ar and/or $N_2$, or a reducing gas such as $H_2$ or a combination thereof at a temperature between about 300° C.–450° C. to form an annealed ruthenium-containing film having a resistivity at least about 10% less or at least about 15% less than the ruthenium-containing film (prior to annealing). The ruthenium-containing film may be formed from ALD, CVD, or ALD and CVD comprising delivering one or more of:

($\eta^4$-buta-1,3-diene)tricarbonylruthenium;
($\eta^4$-2,3-dimethylbuta-1,3-diene)tricarbonylruthenium; and
($\eta^4$-2-methylbuta-1,3-diene)tricarbonylruthenium, and an oxygen-free co-reactant as described herein to a substrate.

In further embodiments, methods of lowering the resistivity of a ruthenium-containing film may comprise plasma treating the ruthenium-containing film in addition to or instead of annealing the ruthenium containing film under vacuum, or in the presence of an inert gas such as Ar, $N_2$, or a reducing gas such as $H_2$ or a combination thereof at a temperature between about 300° C.–450° C., to form a treated ruthenium-containing film having a resistivity at least about 10% less or at least about 15% less than the ruthenium-containing film (prior to post-deposition treatment). The ruthenium-containing film may be formed from ALD, CVD, or ALD and CVD comprising delivering one or more of:

($\eta^4$-buta-1,3-diene)tricarbonylruthenium;
($\eta^4$-2,3-dimethylbuta-1,3-diene)tricarbonylruthenium; and
($\eta^4$-2-methylbuta-1,3-diene)tricarbonylruthenium, and an oxygen-free co-reactant as described herein to a substrate.

Applications

The ruthenium films formed from the ALD and/or CVD processes described herein are useful for memory and/or logic applications, such as dynamic random access memory (DRAM), complementary metal oxide semi-conductor (CMOS) and 3D NAND, 3D Cross Point and ReRAM.

Reference throughout this specification to "one embodiment," "certain embodiments," "one or more embodiments" or "an embodiment" means that a particular feature, structure, material, or characteristic described in connection with the embodiment is included in at least one embodiment of the present technology. Thus, the appearances of the phrases such as "in one or more embodiments," "in certain embodiments," "in one embodiment" or "in an embodiment" in various places throughout this specification are not necessarily referring to the same embodiment of the present technology. Furthermore, the particular features, structures, materials, or characteristics may be combined in any suitable manner in one or more embodiments.

Although the present technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the present technology. Thus, it is intended that the present technology include modifications and variations that are within the scope of the appended claims and their equivalents. The present technology, thus generally described, will be understood more readily by reference to the following examples, which is provided by way of illustration and is not intended to be limiting.

EXAMPLES (DMBD)Ru(CO)$_3$ was utilized as the precursor in the following examples. Methods of preparing (DMBD)Ru(CO)$_3$ are known in the art. For example, see U.S. 2011/0165780, which is incorporated herein by reference in its entirety.

Figure 2:
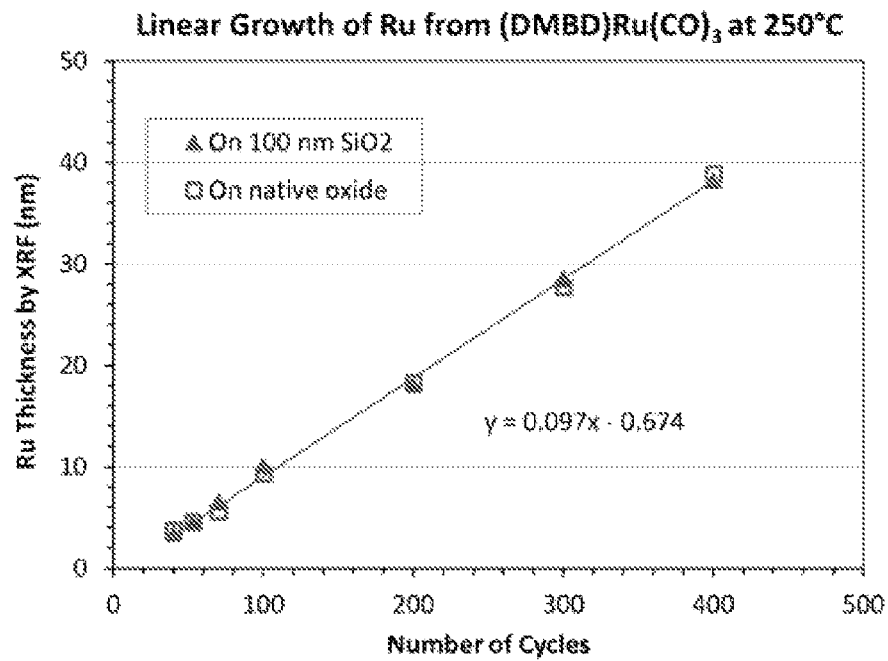
FIG. 2 is a graphical representation of ruthenium film thickness (nm) vs. number of cycles demonstrating linear growth at 250° C. for ALD of ruthenium using oxygen and (DMBD)Ru(CO)$_3$.

Comparative Example 1—ALD of Ruthenium Using (DMBD)Ru(CO)$_3$ and O$_2$ without Annealing For comparison, a baseline O$_2$ ALD process was carried out with (DMBD)Ru(CO)$_3$. Ru was deposited in a CN-1 ALD/CVD reactor equipped with a dry vacuum pump and an adjustable throttle valve for pressure control. (DMBD)Ru(CO)$_3$ was placed in a stainless container, heated to about 40° C. for bubbler delivery, or up to 70° C. for vapor draw delivery, with a carrier gas flow of 20 sccm Ar and additional 50 sccm Ar for purging. The pulse time was typically 1-2 seconds, and purge time 10 seconds. Oxygen gas 20 sccm, pulse time of 3 sec and purge time of 10 sec. with 30 sccm of Ar. The deposition pressure was about 0.3 Torr. The results with various deposition temperatures and film thicknesses are shown in FIG. 1 and FIG. 2. The ALD window was in the range of 200-265° C. There was significant thermal decomposition of (DMBD)Ru(CO)$_3$ at ~275° C. and higher. There was a short nucleation delay of ≤7 cycles. A low resistivity (~20 μΩ-cm) film was produced.

Example 2—O$_2$-Free ALD of Ruthenium Using (DMBD)Ru(CO)$_3$ and Hydrazine (Saturation Data)

Figure 3:
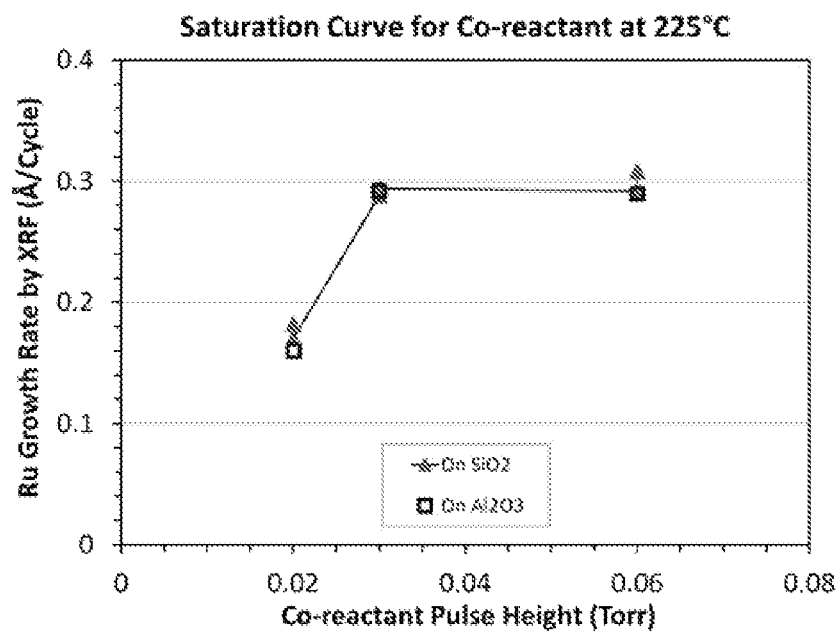
FIG. 3 is a graphical representation of oxygen-free ALD ruthenium film growth rate by X-ray Fluorescence (XRF) (Å/cycle) using (DMBD)Ru(CO)$_3$ vs. hydrazine co-reactant pulse height (Torr) demonstrating the saturation curve for hydrazine co-reactant at 225° C.
Figure 4:
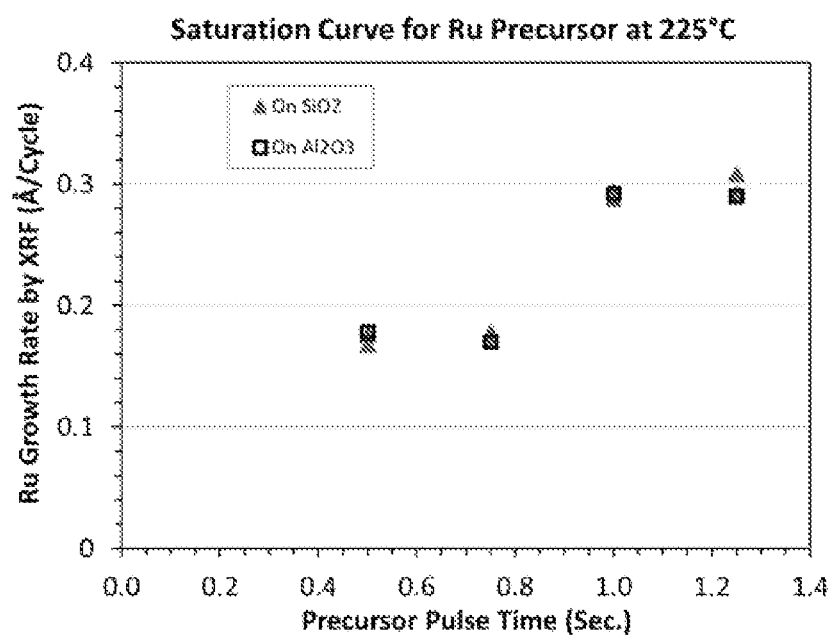
FIG. 4 is a graphical representation of oxygen-free ALD ruthenium film growth rate by XRF (Å/cycle) using (DMBD)Ru(CO)$_3$ vs. precursor pulse time (Sec.) demonstrating the saturation curve for the precursor (DMBD)Ru(CO)$_3$ at 225° C.

Oxygen-free ruthenium was deposited in the same ALD/CVD reactor described in Example 1 with the same (DMBD)Ru(CO)$_3$ precursor setup, and was heated to about 40° C. for bubbler delivery, with a 20 sccm Ar carrier gas flow and 30 sccm Ar for purging. Oxygen-free co-reactant hydrazine was delivered at room temperature without heating (20-30° C.) by vapor draw with 20 sccm Ar carrier gas and 30 sccm Ar purge gas. The (DMBD)Ru(CO)$_3$ pulse time was typically 1 second unless noted otherwise and purge time 5-10 seconds, a hydrazine co-reactant pulse time of 0.075 seconds and purge time 5-10 seconds. The standard deposition pressure was 0.3 Torr. For FIGS. 3 and 4, the deposition temperature was 225° C. and 500 cycles each with Ru thickness ranging from 85-150 Å by XRF. FIGS. 3 and 4 demonstrate ALD-type deposition with saturation behavior for hydrazine co-reactant and (DMBD)Ru(CO)$_3$ precursor. A similar growth rate was achieved on SiO$_2$ and Al$_2$O$_3$.

Example 3—O$_2$-Free ALD of Ruthenium Using (DMBD)Ru(CO)$_3$ and Hydrazine (Nucleation and Linear Growth)

Figure 5:
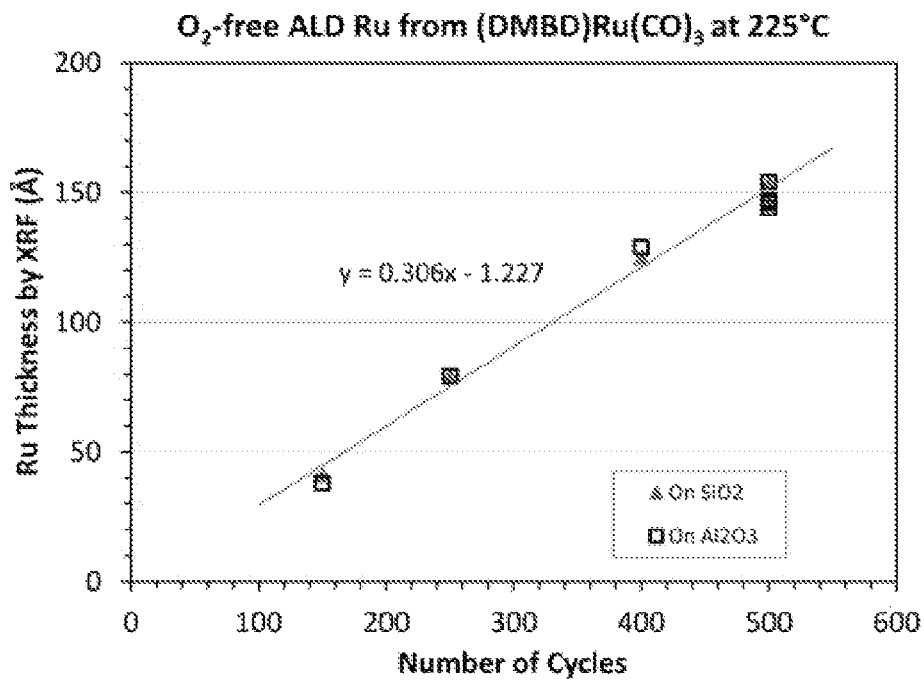
FIG. 5 is a graphical representation of ruthenium film thickness by XRF (Å) vs. number of cycles for oxygen-free ALD of ruthenium using (DMBD)Ru(CO)$_3$ and hydrazine co-reactant at 225° C.
Figure 6:
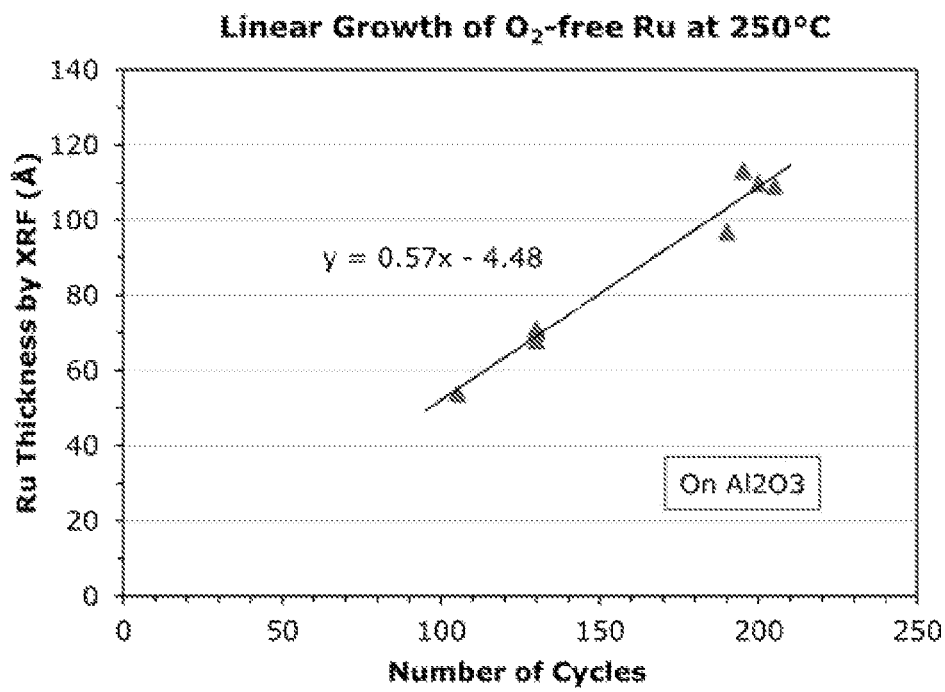
FIG. 6 is a graphical representation of ruthenium film thickness by XRF (Å) vs. number of cycles for oxygen-free ALD of ruthenium using (DMBD)Ru(CO)$_3$ and hydrazine co-reactant at 250° C.

The same procedure as in Example 2 was carried out except for a different deposition temperature (or substrate temperature) of 225° C. for FIG. 5 and 250° C. for FIG. 6.

FIGS. 5 and 6 demonstrate a short extrapolated nucleation delay (≤8 cycles), similar to O$_2$ process, similar growth rate and nucleation behavior on SiO$_2$ and Al$_2$O$_3$, and sufficiently high growth rate: about 0.3 Å/cycle at 225° C., up to 0.6 Å/cycle at 250° C.

Example 4—O$_2$-Free ALD of Ruthenium Using (DMBD)Ru(CO)$_3$ and Hydrazine or Ammonia (XPS Composition of as-Deposited Films)

Figure 7A:
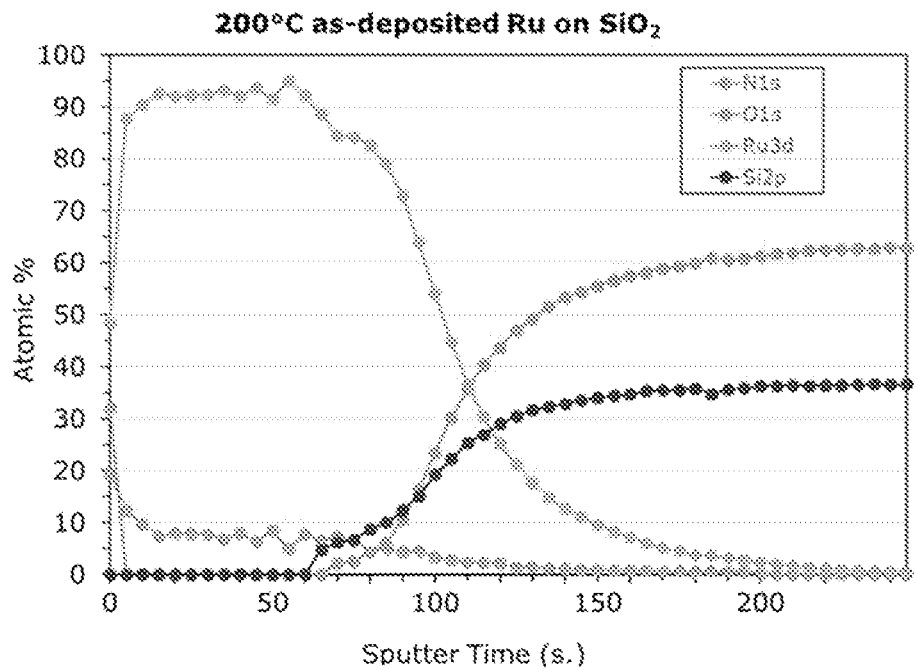
FIGS. 7A, 7B, 7C, 7D and 7E are graphical representations of atomic % vs. sputter time (s.) as determined by X-ray Photoelectron Spectroscopy (XPS) for as-deposited ruthenium films on SiO$_2$ substrates formed from oxygen-free ALD using (DMBD)Ru(CO)$_3$ and hydrazine co-reactant at substrate temperatures of 200° C., 225° C., 250° C., 275° C., and 300° C., respectively.
Figure 7B:
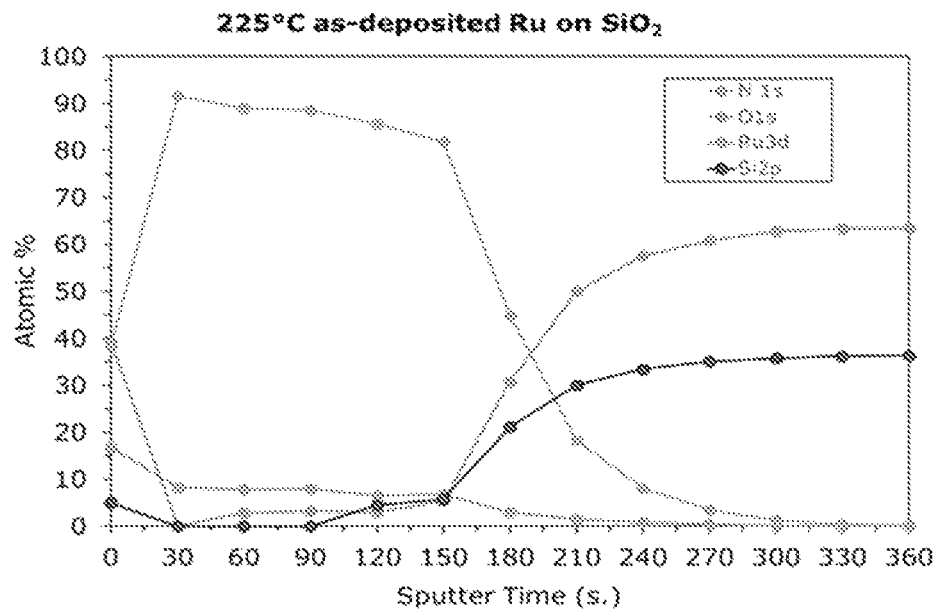
Figure 7C:
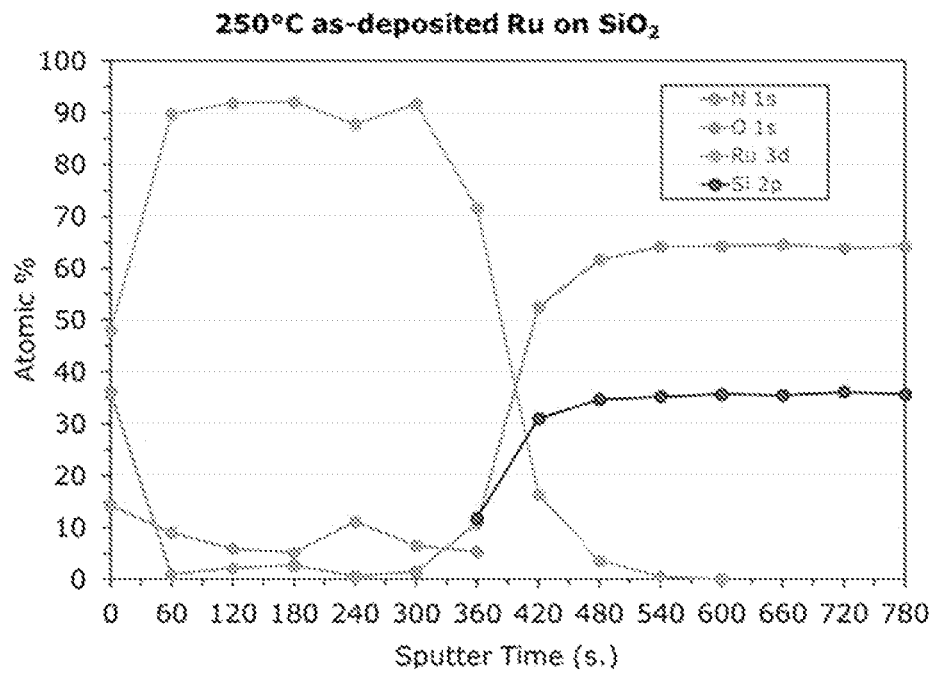
Figure 7D:
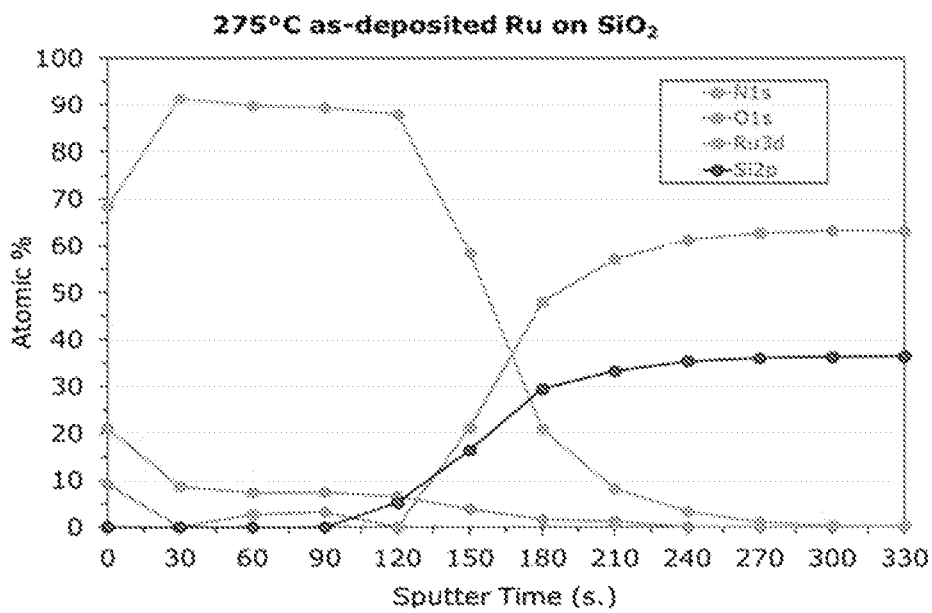
Figure 7E:
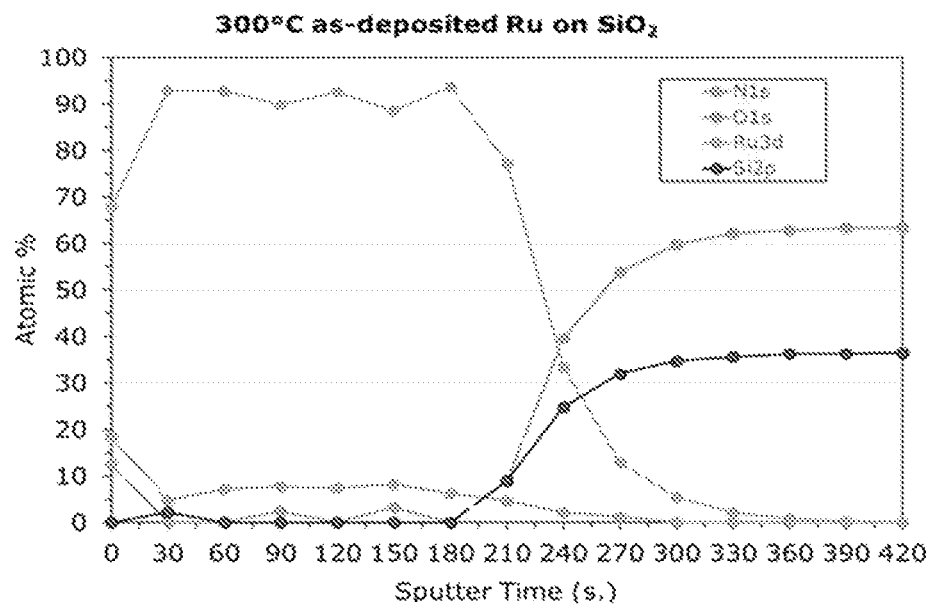
Figure 7F:
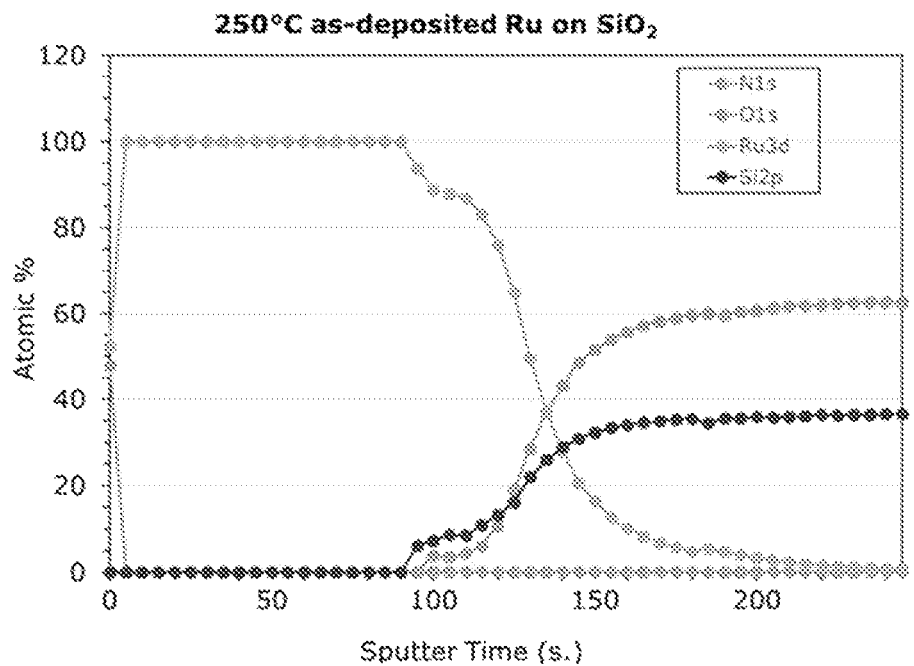
FIG. 7F is graphical representation of atomic % vs. sputter time (s.) as determined by XPS for as-deposited ruthenium film on SiO$_2$ substrate formed from oxygen-free ALD using (DMBD)Ru(CO)$_3$ and ammonia co-reactant at substrate temperature 250° C.

The same procedure was carried out as in Example 2 for hydrazine co-reactant except at variable deposition temperature from 200° C. to 300° C. for FIGS. 7A-7E. For oxygen-free ruthenium using ammonia co-reactant as shown in FIG. 7F, the deposition was carried out in the same ALD/CVD reactor described in Example 2 with (DMBD)Ru(CO)$_3$ heated to about 40° C. for bubbler delivery of 1 second pulse and 5 second purge (50 sccm Ar), and ammonia was delivered at 35 sccm with a pulse time of 3 seconds, purge time of 6 seconds with 30 sccm of Ar. The deposition pressure for the ammonia ALD process was 0.3 Torr and deposition temperature was 250° C. for 700 cycles with Ru thickness about 130 Å by XRF. The growth rate with ammonia was about 0.18 Å/cycle (about ⅓ of hydrazine at 250° C.) and post-annealed resistivity was about 170 μΩ-cm (about twice as high as Ru with hydrazine co-reactant). The reason is explained by the difference in the nitrogen content in the as-deposited intermediate film. FIGS. 7A-7E demonstrate the existence of 7-10 at % N and very low level of O in as-deposited Ru films from the hydrazine co-reactant. FIG. 7F demonstrates the absence of nitrogen using the ammonia co-reactant. The absence of nitrogen in the as-deposited ammonia ALD film may be due to little or low reactivity of ammonia with the ruthenium precursor as shown with the very low growth rate mainly due to thermal decomposition of the ruthenium precursor. The film from the ammonia process may have contained more carbon impurity that cannot be separated from ruthenium by XPS.

Example 5—O$_2$-Free ALD of Ruthenium Using (DMBD)Ru(CO)$_3$ and Hydrazine (ALD Window for (DMBD)Ru(CO)$_3$)

The same procedure as described in Example 2 was carried out except at various deposition temperatures. Film thickness ranged from about 110 Å to about 270 Å by XRF.

Figure 8:
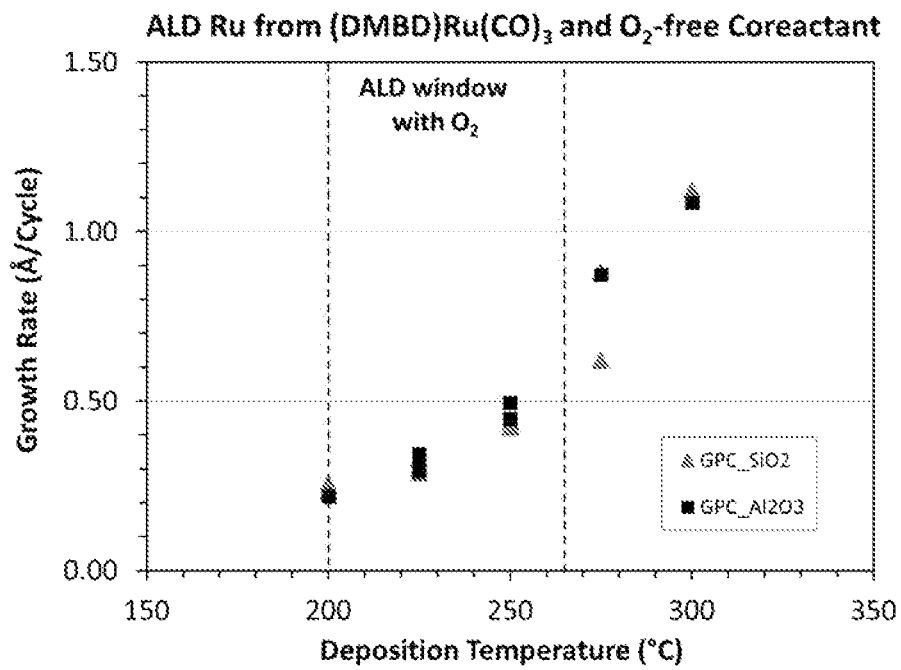
FIG. 8 is a graphical representation of ruthenium film growth rate (Å/cycle) vs. deposition temperature (° C.) for oxygen-free ALD of ruthenium using (DMBD)Ru(CO)$_3$ and hydrazine co-reactant.

FIG. 8 demonstrates the lack of a conventional ALD window unlike the O$_2$ ALD process shown in FIG. 1 likely due to lower reactivity of hydrazine at lower temperatures. The significant increase in Ru growth rate at 275° C. or higher was due to rapid thermal decomposition of the (DMBD)Ru(CO)$_3$ precursor.

Figure 9:
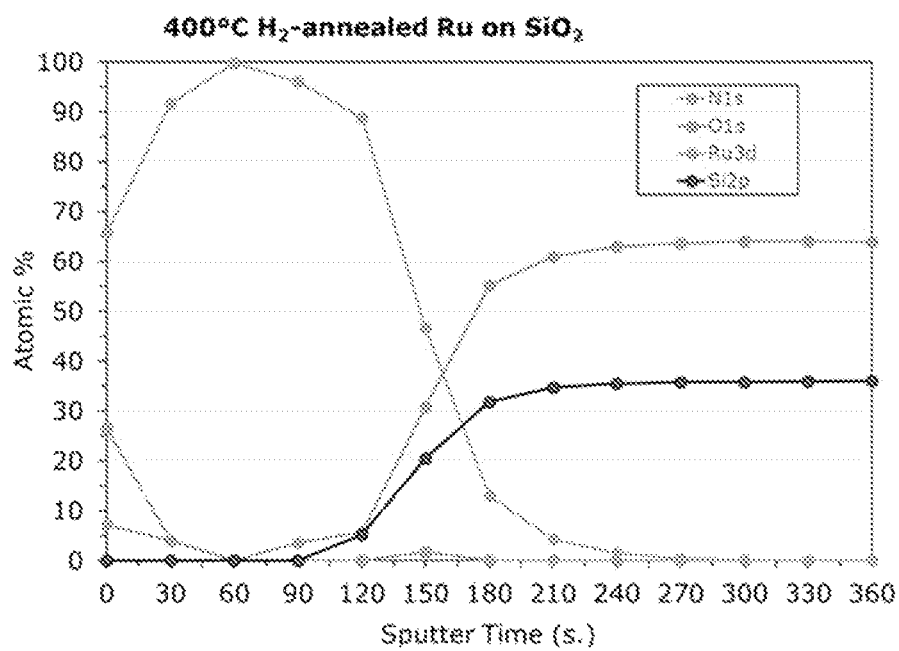
FIG. 9 is a graphical representation of atomic % vs. sputter time (s.) as determined by XPS for a ruthenium film formed by oxygen-free ALD of ruthenium on SiO$_2$ at 225° C. using (DMBD)Ru(CO)$_3$ and hydrazine co-reactant followed by annealing with 5% H$_2$ in Ar at 400° C.

Example 6—O$_2$-Free ALD of Ruthenium at 225° C. Using (DMBD)Ru(CO)$_3$ and Hydrazine Followed by Annealing with 5% H$_2$ in Ar The same film from FIG. 7B deposited at 225° C. was then annealed in 5% H$_2$ in Ar at 400° C., 1.5 Torr pressure for 30 minutes. FIG. 9 demonstrates complete loss of nitrogen (~0 at % or below XPS detection limit).

Figure 10:
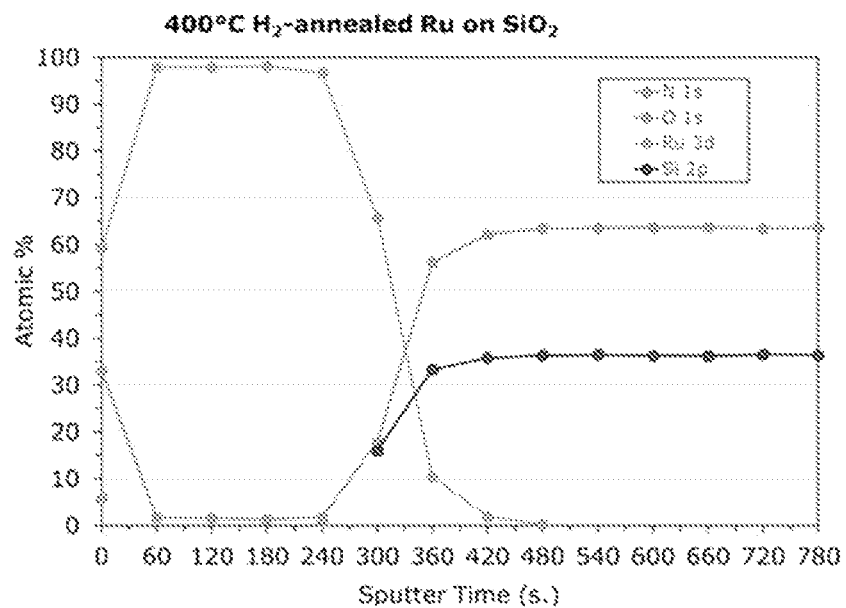
FIG. 10 is a graphical representation of atomic % vs. sputter time (s.) as determined by XPS for a ruthenium film formed by oxygen-free ALD of ruthenium on SiO$_2$ at 250° C. using (DMBD)Ru(CO)$_3$ and hydrazine co-reactant followed by annealing with 5% H$_2$ in Ar at 400° C.

Example 7—O$_2$-Free ALD of Ruthenium at 250° C. Using (DMBD)Ru(CO)$_3$ and Hydrazine Followed by Annealing with 5% H$_2$ in Ar The same film from FIG. 7C deposited at 250° C. was then annealed in 5% H$_2$ in Ar at 400° C., 1.5 Torr pressure for 30 minutes. FIG. 10 demonstrates complete loss of nitrogen (~0 at % or below XPS detection limit).

Example 8—Comparison of as-Deposited Ru Films Vs. Ru Films Annealed at Various Temperatures with 5% H$_2$ in Ar Following 02-Free ALD Using (DMBD)Ru(CO)$_3$ and Hydrazine Annealing procedure: a ruthenium film was deposited on large silicon coupons with silicon oxide and/or alumina oxide at each deposition temperature as described in Example 2. A large coupon was measured and then diced into multiple smaller chips in air. Each small chip was then individually annealed in 5% H$_2$ in Ar at 1.5 Torr pressure with a gas flow rate of about 150 sccm for 30 minutes at a given anneal temperature from 300° C. to 425° C.

I. Loss of Nitrogen

Figure 11:
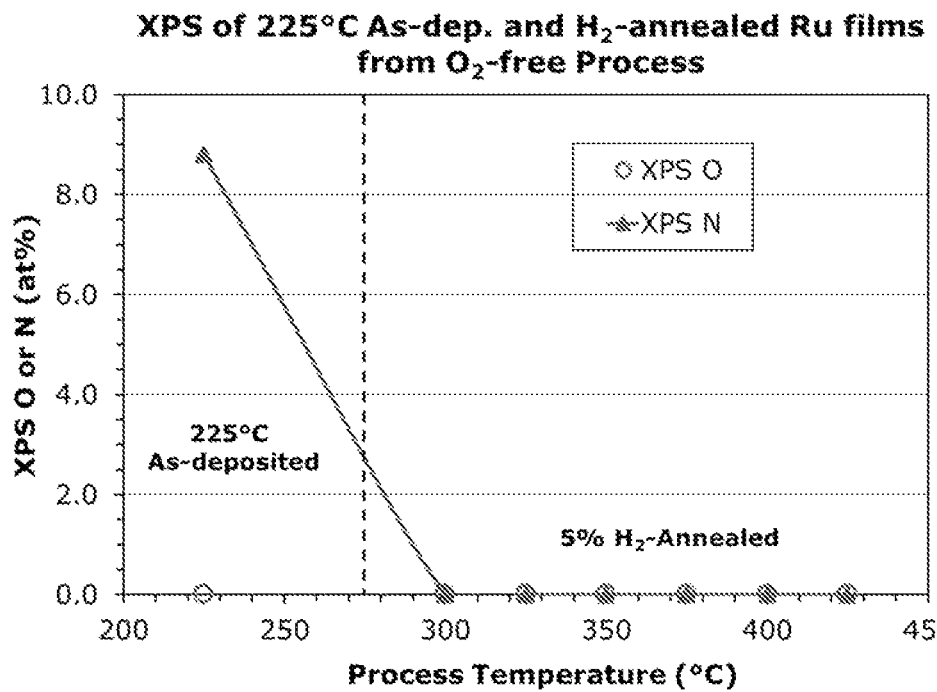
FIG. 11 is a graphical representation of an XPS analysis of oxygen and nitrogen (at %) vs. process temperature (° C.) of a 225° C. as-deposited ruthenium film and annealed in 5% H$_2$ in Ar at various temperatures from 300° C. to 450° C. Each annealed sample was split from the same silicon coupon with the same ruthenium film grown by oxygen-free ALD using (DMBD)Ru(CO)$_3$ and hydrazine co-reactant on silicon oxide at 225° C.

FIG. 11 demonstrates complete loss of nitrogen upon annealing in 5% H$_2$ in Ar at ≥300° C.

II. Film Shrinkage and Densification

Figure 12:
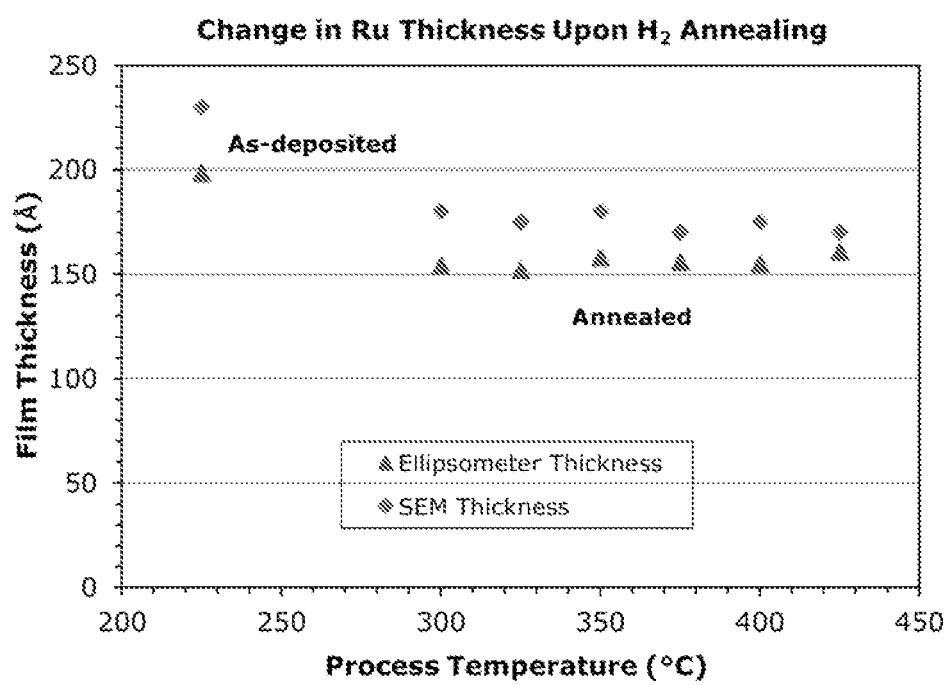
FIG. 12 is a graphical representation of ruthenium film thickness (Å) vs. process temperature (° C.) demonstrating film densification with a decrease in ruthenium thickness due to loss of nitrogen after 5% H$_2$ in Ar annealing of a ruthenium film grown at 225° C. by oxygen-free ALD using (DMBD)Ru(CO)$_3$ and hydrazine co-reactant.
Figure 13A:
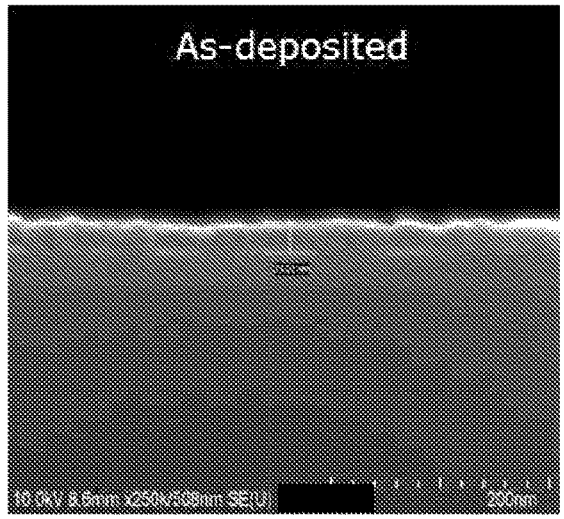
FIGS. 13A, 13B, 13C and 13D are scanning electron microscopy (SEM) cross-sectional views of a 225° C. as-deposited ruthenium film, a 300° C. 5% H$_2$ in Ar annealed ruthenium film, a 350° C. 5% H$_2$ in Ar annealed ruthenium film, and a 400° C. 5% H$_2$ in Ar annealed ruthenium film. Each annealed sample was split from the same silicon chip with a ruthenium film grown at 225° C. by oxygen-free ALD using (DMBD)Ru(CO)$_3$ and hydrazine co-reactant.
Figure 13B:
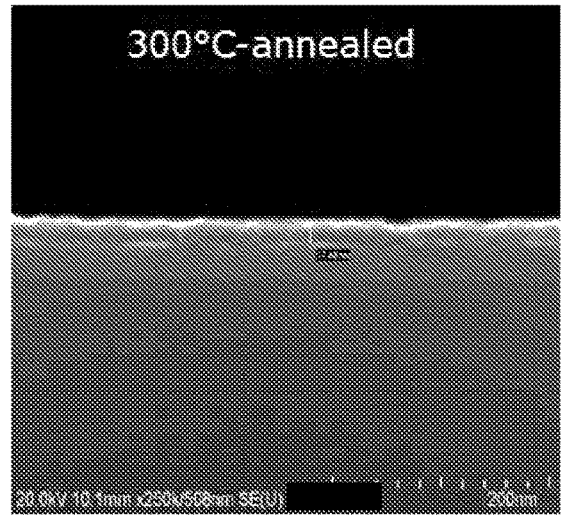
Figure 13C:
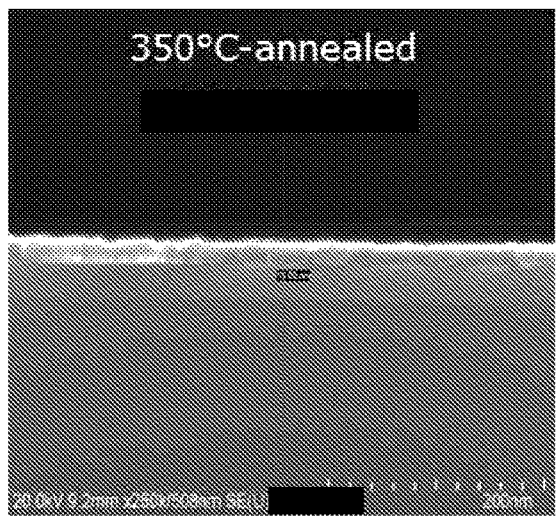
Figure 13D:
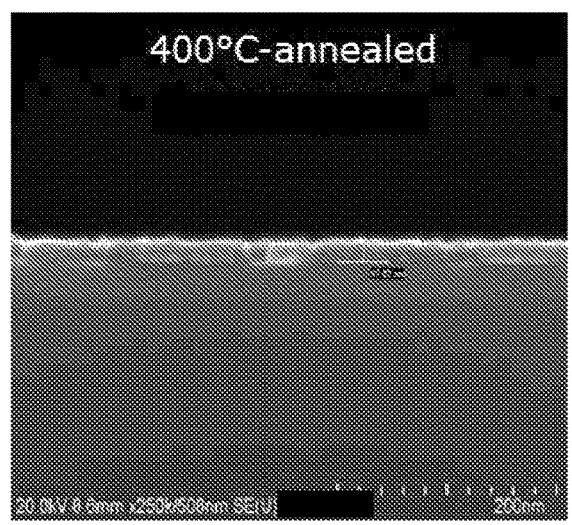
Figure 14A:
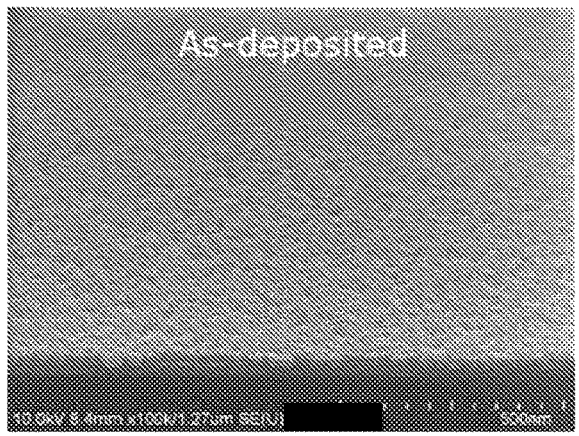
FIGS. 14A, 14B, 14C and 14D are SEM top views of a 225° C. as-deposited ruthenium film, a 300° C. 5% H$_2$ in Ar annealed ruthenium film, a 350° C. 5% H$_2$ in Ar annealed ruthenium film, and a 400° C. 5% H$_2$ in Ar annealed ruthenium film. Each annealed sample was split from the same silicon chip with a ruthenium film grown at 225° C. by oxygen-free ALD using (DMBD)Ru(CO)$_3$ and hydrazine co-reactant.
Figure 14B:
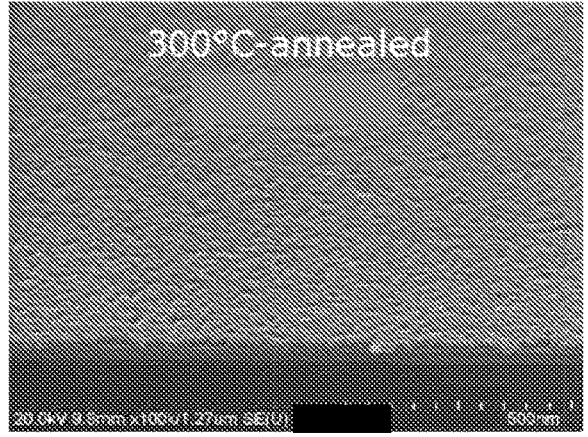
Figure 14C:
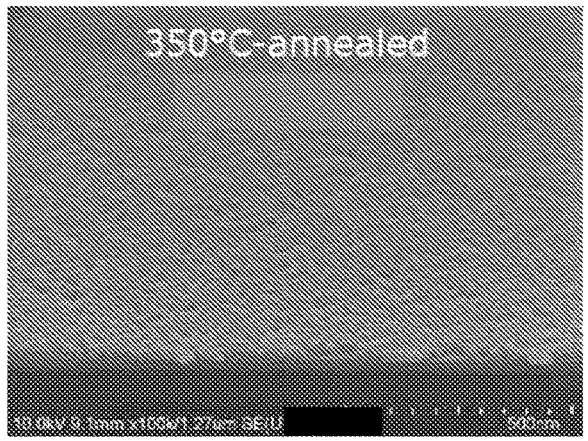
Figure 14D:
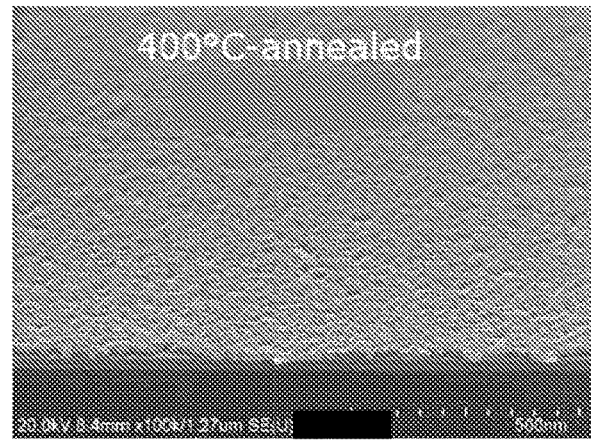

The same chips from the same deposition on alumina oxide as shown in FIG. 11 were used for thickness measurement by optical ellipsometry and SEM. FIG. 12 demonstrates film shrinkage upon annealing due to loss of nitrogen and thermally induced film densification.

FIGS. 13A-13D demonstrate a trend of 20-25% film shrinkage with 5% H$_2$ in Ar annealing at 300-400° C.

FIGS. 14A-14D demonstrate no significant change in Ru surface morphology or grain size with 5% H$_2$ in Ar annealing at 300-400° C.

III. Resistivity

Figure 15:
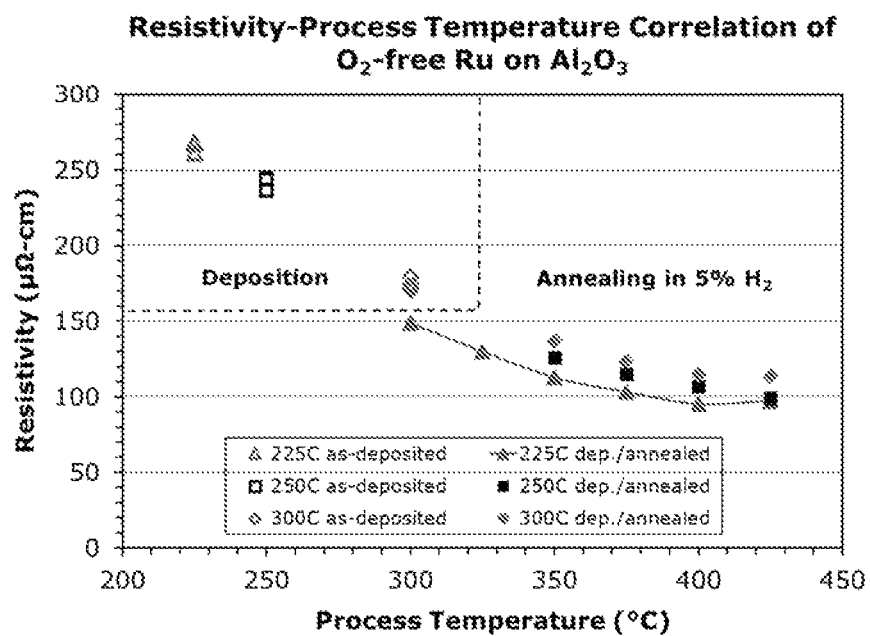
FIG. 15 is a graphical representation of resistivity (μΩ-cm) vs. process temperature (° C.) demonstrating the effect of deposition temperature at 225, 250 and 300° C. and the effect of annealing temperature from 300 to 425° C. on resistivity of ruthenium films grown by oxygen-free ALD using (DMBD)Ru(CO)$_3$ and hydrazine co-reactant on an aluminum oxide substrate.

FIG. 15 demonstrates that the optimal annealing temperature is about 400° C. or higher regardless of the deposition temperature ranging from 225° C. to 300° C.

Figure 16:
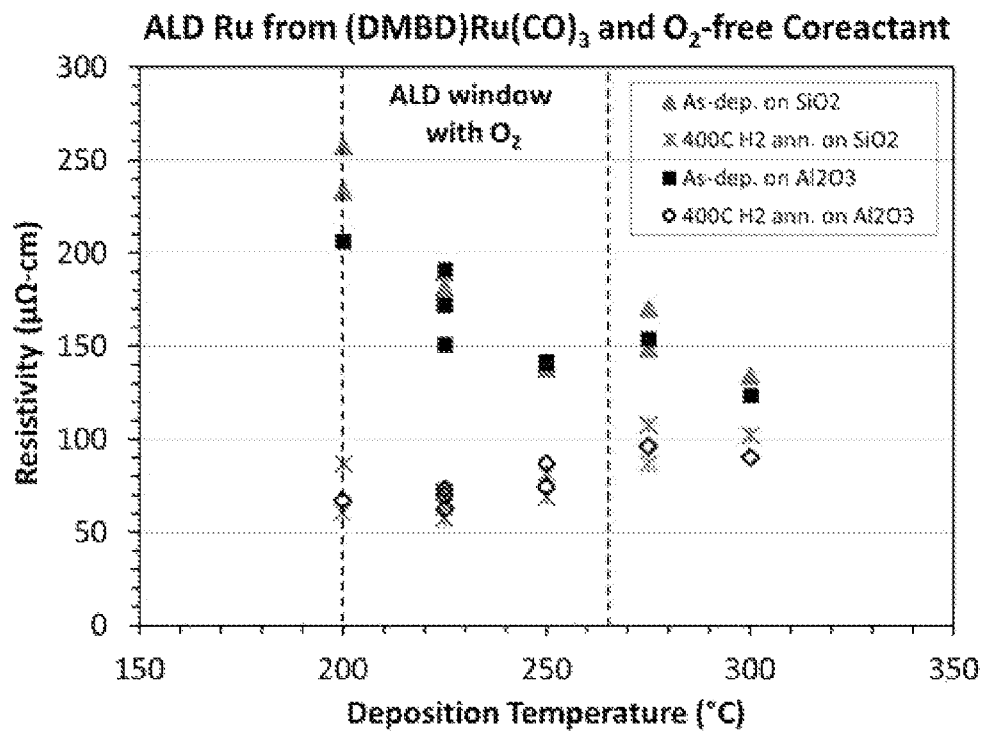
FIG. 16 is a graphical representation of resistivity (μΩ-cm) vs. deposition temperature (° C.) demonstrating resistivity-deposition temperature correlation of oxygen-free ALD using (DMBD)Ru(CO)$_3$ and hydrazine co-reactant for an as-deposited film on silicon oxide, an as-deposited film on aluminum oxide, a film annealed with 5% H$_2$ in Ar at 400° C. on silicon oxide, and a film annealed with 5% H$_2$ in Ar at 400° C. on aluminum oxide.

FIG. 16 demonstrates that optimal deposition temperature for low resistivity after annealing is 200° C. to 225° C.

Figure 17:
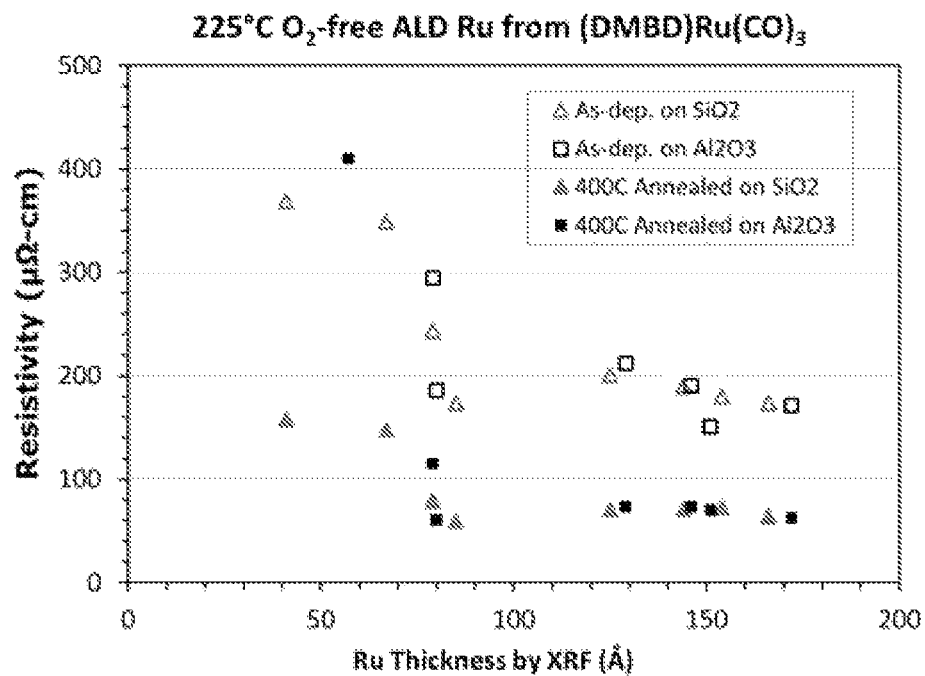
FIG. 17 is a graphical representation of resistivity (μΩ-cm) vs. ruthenium film thickness by XRF (Å) following oxygen-free ALD using (DMBD)Ru(CO)$_3$ and hydrazine co-reactant, and a substrate temperature of 225° C. for an as-deposited film on silicon oxide, an as-deposited film on aluminum oxide, a film annealed with 5% H$_2$ in Ar at 400° C. on silicon oxide, and a film annealed with 5% H$_2$ in Ar at 400° C. on aluminum oxide.

FIG. 17 demonstrates that the annealing step may be required for low resistivity for the whole thickness range tested.

Summary: Low resistivity ruthenium films (60-80 $\mu\Omega$-cm) were obtained by a two-step $O_2$-free process. In this example, the two-step process involved ALD of a nitrogen-containing intermediate film using (DMBD)Ru(CO)$_3$ and hydrazine or alkylhydrazine at 200-300° C. substrate temperature, followed by annealing at 300-400° C. in hydrogen. A sufficient growth rate (0.3-0.6 Å/cycle) at 200-250° C. substrate temperature was achieved in ALD mode.

Example 9—Comparison of as-Deposited Ru Films Vs. Ru Films Annealed with Ar Vs. Ru Films Annealed with 5% H$_2$ in Ar Following 02-Free ALD Using (DMBD)Ru(CO)$_3$ and Hydrazine The argon annealing procedure was the same as previously described for 5% H$_2$ in Ar anneal except that no H$_2$ was used, at 1.5 Torr pressure with a gas flow rate of about 150 sccm for 30 minutes.

I. Loss of Nitrogen

Figure 18:
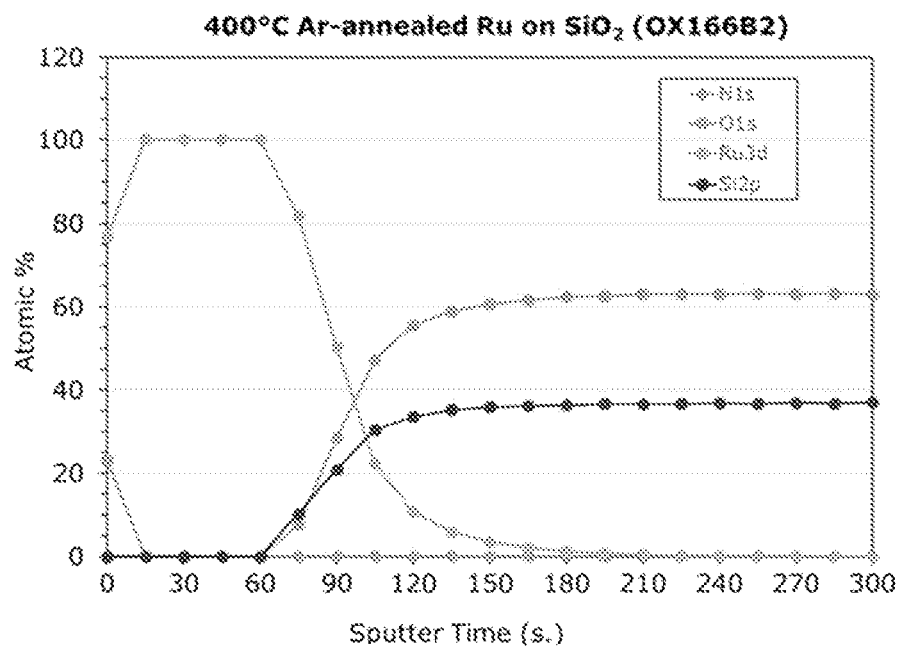
FIG. 18 is a graphical representation of atomic % vs. sputter time (s.) as determined by XPS for a ruthenium film formed by oxygen-free ALD of ruthenium on SiO$_2$ at 225° C. using (DMBD)Ru(CO)$_3$ and hydrazine co-reactant followed by annealing in Ar at 400° C.

FIG. 18 demonstrates complete loss of nitrogen (~0 at % or below XPS detection limit) after 400° C. argon anneal. The pre-annealed film was deposited at 225° C. as described in Example 2.

Figure 19:
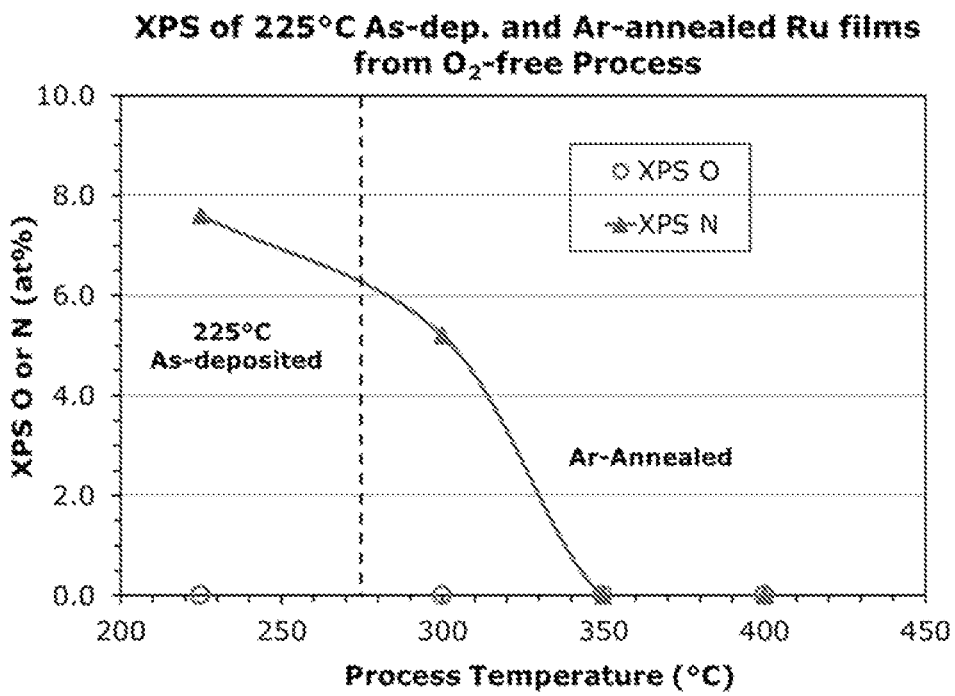
FIG. 19 is a graphical representation of an XPS analysis of oxygen and nitrogen (at %) vs. process temperature (° C.) of a 225° C. as-deposited ruthenium film and annealed in argon at 300° C., 350° C. and 400° C., demonstrating film purification with partial loss of nitrogen upon annealing at 300° C. and complete loss of nitrogen upon annealing at 350° C. or higher. Each annealed sample was split from the same silicon coupon with a ruthenium film grown at 225° C. by oxygen-free ALD using (DMBD)Ru(CO)$_3$ and hydrazine co-reactant on silicon oxide substrate.

All data in FIG. 19 are from the same ruthenium film deposited on a large silicon coupon at 225° C. by oxygen-free ALD as in Example 2 and split into small chips as described in Example 8. FIG. 19 demonstrates that nitrogen in as-deposited ruthenium film can also be removed without using hydrogen by annealing in argon, but needs a slightly higher temperature of about 350° C. or higher to be removed completely.

II. Resistivity

Figure 20:
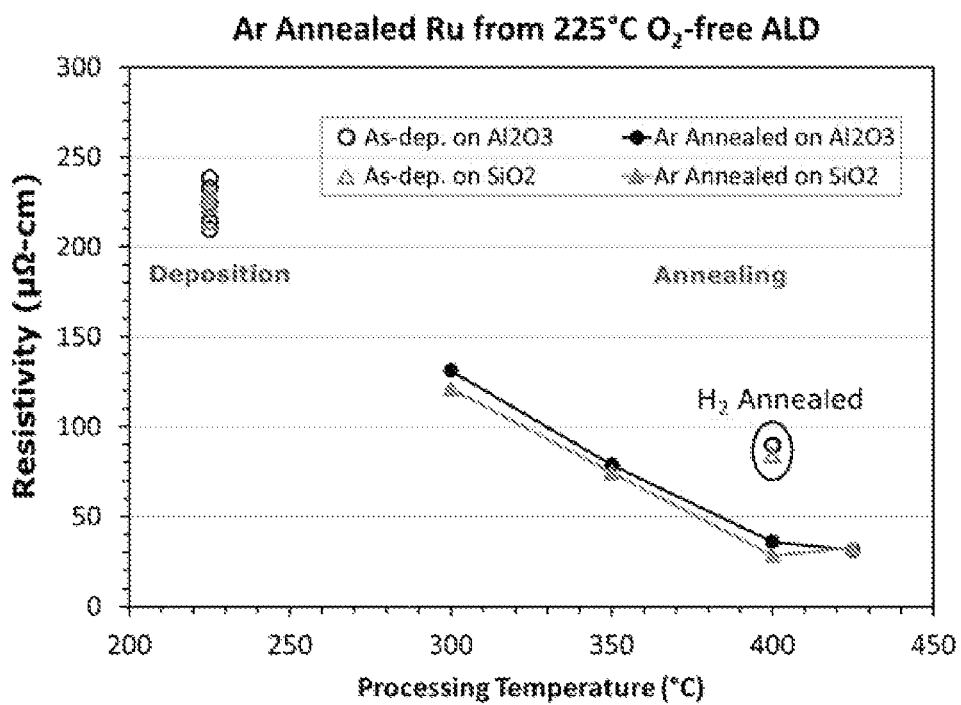
FIG. 20 is a graphical representation of resistivity (μΩ-cm) vs. process temperature (° C.) demonstrating the effect of argon annealing temperature on resistivity and a comparison with 5% H$_2$ in argon annealing at 400° C. for the same ruthenium film deposited by oxygen-free ALD using (DMBD)Ru(CO)$_3$ and hydrazine co-reactant and a substrate temperature of 225° C. on aluminum oxide and on silicon oxide.

FIG. 20 demonstrates that the optimal annealing temperature using argon is also about 400° C. or higher and similar to 5% H$_2$ in Ar annealing. Further, Ar annealing can result in significantly lower resistivity than 5% H$_2$ in Ar anneal at the optimal annealing temperature, possibly due to elimination of hydrogen contamination in the annealed ruthenium film.

Figure 21:
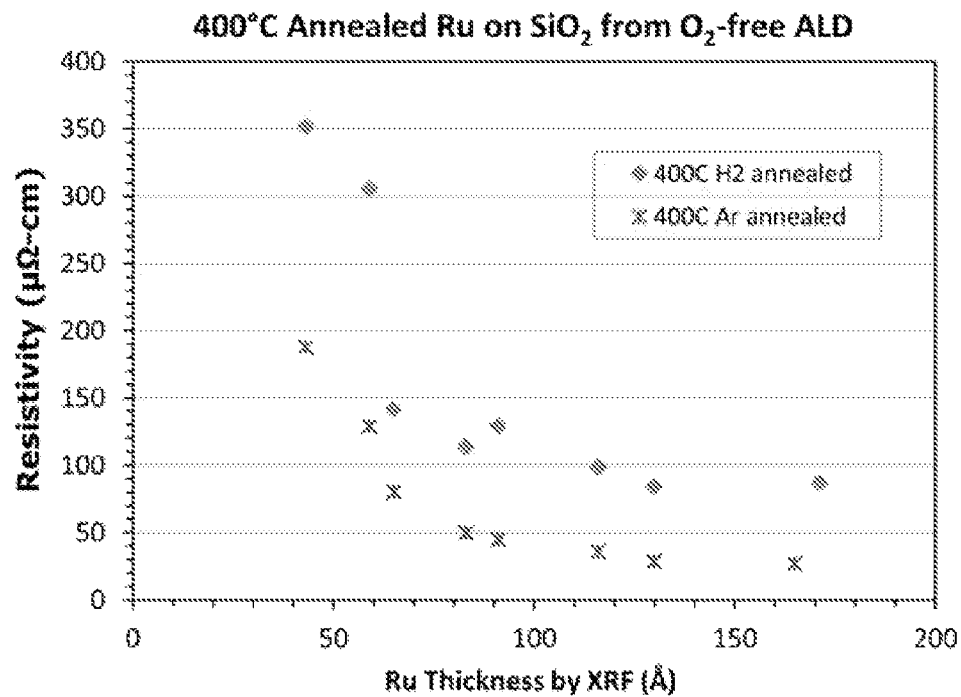
FIG. 21 is a graphical representation of resistivity (μΩ-cm) vs. ruthenium film thickness by XRF (Å) comparing argon annealing with 5% H$_2$ in argon annealing at 400° C. for ruthenium films deposited by oxygen-free ALD using (DMBD)Ru(CO)$_3$ and hydrazine co-reactant, and a substrate temperature of 225° C. on silicon oxide.

FIG. 21 demonstrates that 400° C. Ar annealing is consistently better than 400° C. 5% H$_2$ in Ar anneal for a wide range of ruthenium film thickness.

III. Film Shrinkage and Densification

Figure 22:
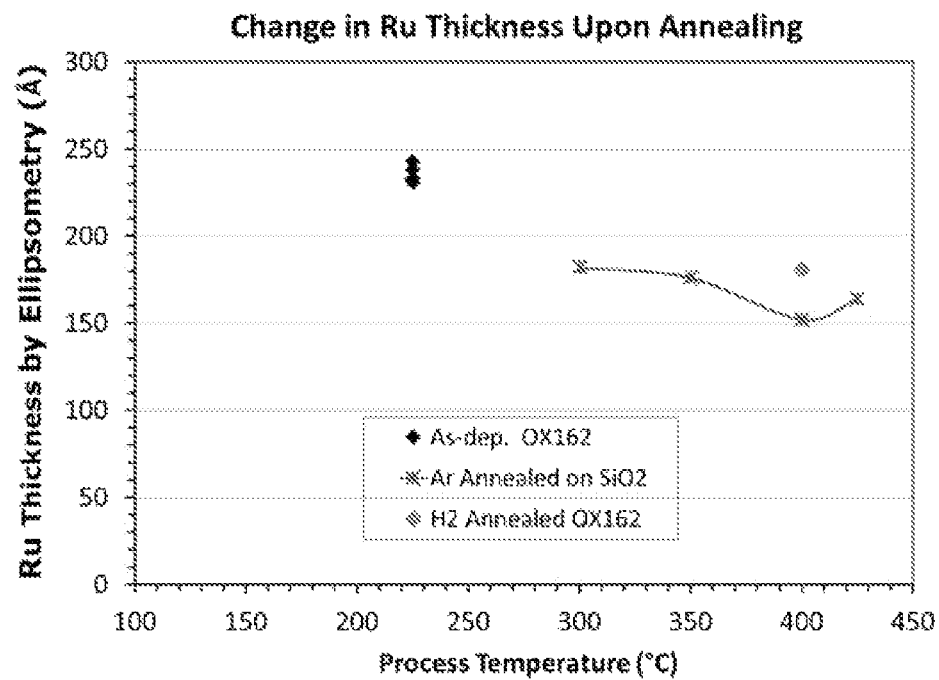
FIG. 22 is a graphical representation of ruthenium film thickness by ellipsometry (Å) vs. process temperature (° C.) demonstrating film purification with decrease in thickness due to loss of nitrogen and densification upon argon annealing at various temperatures from 300° C. to 425° C., and a comparison with 5% H$_2$ in argon annealing at 400° C. for the same ruthenium film deposited by oxygen-free ALD using (DMBD)Ru(CO)$_3$ and hydrazine co-reactant and a substrate temperature of 225° C. on silicon oxide.

FIG. 22 demonstrates that Ar annealing also causes decreases in film thickness due to loss of nitrogen and film densification, and that argon annealing at 400° C. leads to thinner and thus denser film possibly due to elimination of hydrogen contamination than 5% H$_2$ in Ar anneal at the same temperature for the same sample.

Example 10—Nitrogen Annealing

As-deposited ruthenium films were grown on large coupons as described in Example 2 at each temperature (225° C., 250° C.) with Ru thickness of about 150-190 Å. Each coupon was diced into smaller chips for split anneals, one set in 1.5 Torr argon at 400° C. for 30 minutes and another set in 1.5 Torr nitrogen at 400° C. for 30 minutes.

Figure 23:
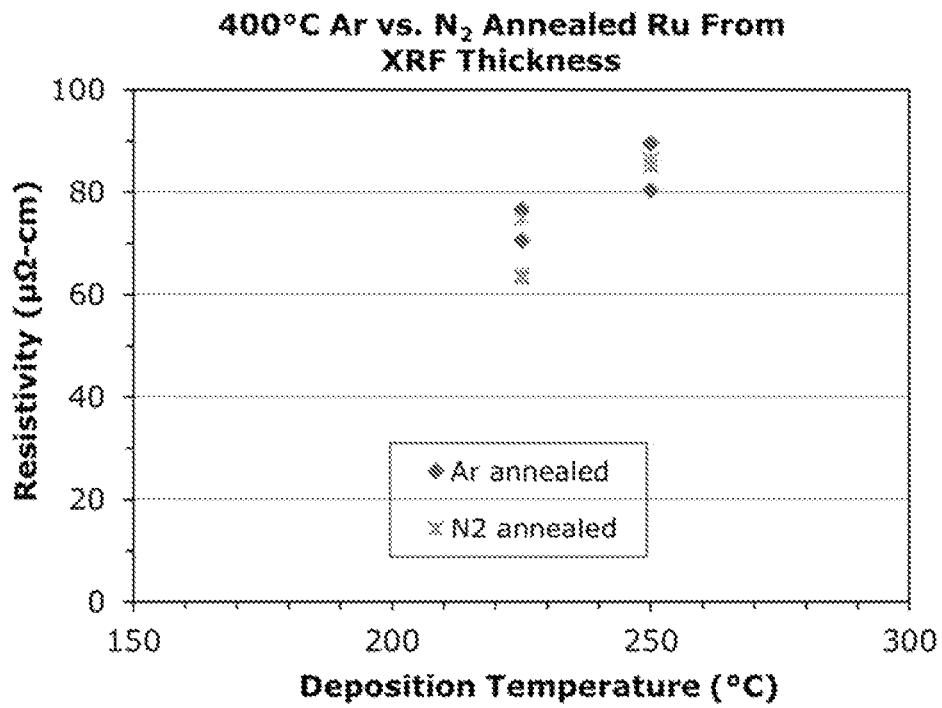
FIG. 23 is a graphical representation of resistivity (μΩ-cm) from XRF ruthenium thickness vs. deposition temperature (° C.) comparing the effect of argon annealing with nitrogen annealing at 400° C. for ruthenium films deposited by oxygen-free ALD using (DMBD)Ru(CO)$_3$ and hydrazine co-reactant on silicon oxide.

FIG. 23 demonstrates that there is no significant difference between argon and nitrogen annealing at 400° C.

Example 11—Vacuum Annealing

As-deposited Ru films, about 130 Å of Ru by XRF, were grown on a large coupon as described in Example 2 and deposited at 200° C. and 1.4 Torr. The coupon was diced into smaller chips for split anneals at 400° C., one in 1.5 Torr argon for 30 minutes and another annealed under dynamic vacuum with a base pressure of 0.035 Torr for 30 minutes. The vacuum chamber was continuously pumped by a dry pump but no purge gas was employed during annealing. Resistivity of the argon annealed sample was 66.1 $\mu\Omega$-cm and resistivity of the vacuum annealed sample was 64.2 $\mu\Omega$-cm, demonstrating comparable performance in the absence of any purge gas for annealing.

Example 12—CVD-Like Reaction by 02-Free ALD Using (DMBD)Ru(CO)$_3$ and Hydrazine The same deposition procedure as in Example 2 was carried out with the same precursor and co-reactant doses and the same gas flow rates and a purge time of 10 sec. each half cycle, except that the throttle valve in the vacuum deposition chamber was partially closed to increase the deposition pressure to 0.95 and 1.4 Torr, respectively. This throttling increased the precursor and co-reactant residence time in the deposition chamber (partial trapping) due to reduced pumping and purging speed, increased the effective reaction time, and added a significant CVD contribution to the ALD process.

Figure 24:
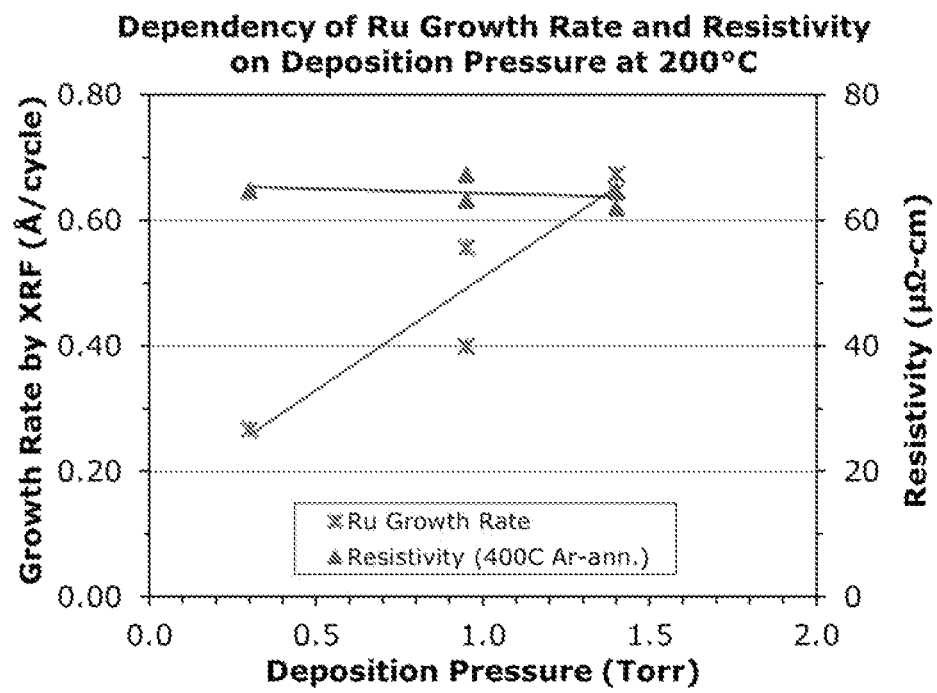
FIG. 24 is a graphical representation of growth rate (Å/cycle) by XRF ruthenium thickness and resistivity (μΩ-cm) of 400° C. argon annealed ruthenium vs. deposition pressure (Torr) for ruthenium films deposited by oxygen-free ALD using (DMBD)Ru(CO)$_3$ and hydrazine co-reactant on silicon oxide at 200° C.

FIG. 24 demonstrates that significantly higher growth rate up to 0.7 Å/cycle at 200° C. can be achieved using the same precursor and co-reactant doses simply by increasing the deposition pressure at the same deposition temperature without increasing resistivity of the annealed ruthenium film.

Summary: A sufficient growth rate (0.3-1 Å/cycle) at substrate temperatures of 200-250° C. in continuous flow mode was achieved. Low resistivity ruthenium films (20-70$\mu\Omega$-cm for ≥13 nm film) were obtained by a two-step O$_2$-free ALD process with argon or nitrogen annealing at 400° C.

Example 13—Conformal Step Coverage

Figure 25:
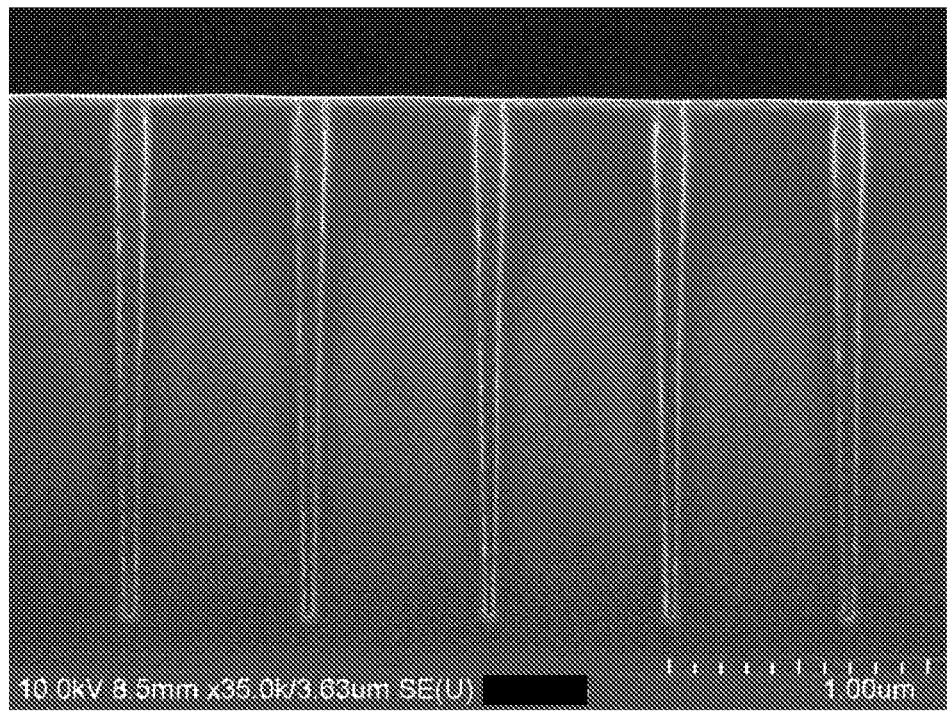
FIG. 25 is an SEM cross-sectional view of a ruthenium film deposited on a silicon via structure pre-coated with a titanium nitride liner. The as-deposited ruthenium film was grown by oxygen-free ALD using (DMBD)Ru(CO)$_3$ and hydrazine co-reactant at 225° C.

FIG. 25 demonstrates conformal step coverage capability of the ALD process using standard deposition conditions as in Example 2 at 225° C. and 0.3 Torr pressure with (DMBD)Ru(CO)$_3$ and hydrazine.

Example 14—O$_2$-Free ALD of Ruthenium Using (DMBD)Ru(CO)$_3$ and Tertiary-Butylhydrazine (tBu-Hydrazine) (Growth Rates and Saturation Data)

Figure 26:
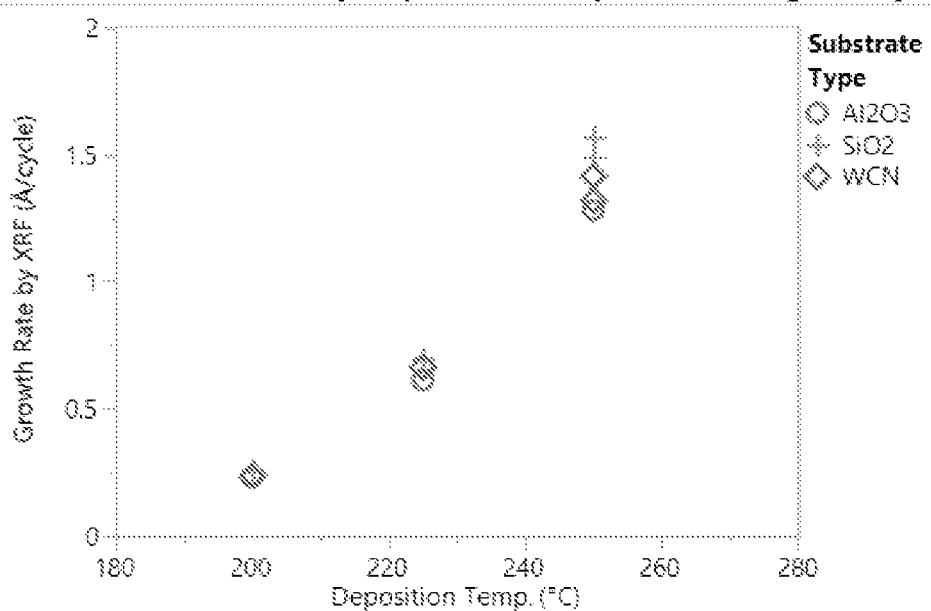
FIG. 26 is a graphical representation of oxygen-free ALD ruthenium film growth rate by XRF (Å/cycle) using (DMBD)Ru(CO)$_3$ and tertiary-butyl hydrazine (tBu-hydrazine) co-reactant and vs. deposition temperature (° C.).
Figure 27:
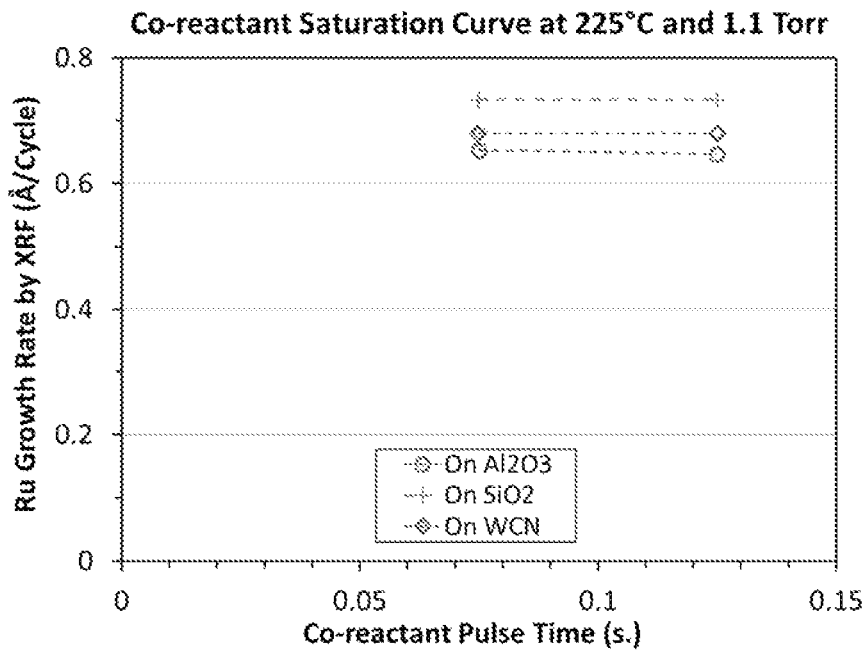
FIG. 27 is a graphical representation of oxygen-free ALD ruthenium film growth rate by XRF (Å/cycle) using (DMBD)Ru(CO)$_3$ vs. tBu-hydrazine co-reactant pulse time (Sec) demonstrating the saturation curve for tBu-hydrazine co-reactant at 225° C.

Oxygen-free ruthenium was deposited on three substrates in the same ALD/CVD reactor described in Example 1 with the same (DMBD)Ru(CO)$_3$ precursor setup, and was heated to about 40° C. for bubbler delivery, with a 20 sccm Ar carrier gas flow and 30 sccm Ar for purging. Unless otherwise indicated, the three substrates were Al$_2$O$_3$, SiO$_2$, and tungsten carbonitride (WCN), wherein the WCN was present as a thin layer (or liner) (thickness of about 2 nm to about 4 nm) on a SiO$_2$ layer (about 100 nm thickness). Oxygen-free co-reactant tertiary-butylhydrazine (tBu-hydrazine) was delivered at room temperature without heating (less than or equal to 29° C.) by vapor draw with 20 sccm Ar carrier gas and 30 sccm Ar purge gas. The (DMBD)Ru(CO)$_3$ pulse time was typically 1 second unless noted otherwise, a purge time of 10 seconds, a tBu-hydrazine co-reactant pulse time of 0.075 seconds, and a purge time 10 seconds. The standard deposition pressure was 1.0-1.1 Torr. Deposition temperatures of 200-250° C. were used. The results with various deposition temperatures on the three substrates and growth rates are shown in FIG. 26. FIG. 27 demonstrate saturation behavior for tBu-hydrazine co-reactant and (DMBD)Ru(CO)$_3$ precursor with a deposition temperature of 225° C. on the three substrates, Al$_2$O$_3$, SiO$_2$, and WCN.

Example 15—O$_2$-Free ALD of Ruthenium Using (DMBD)Ru(CO)$_3$ and tBu-Hydrazine (Nucleation and Linear Growth)

Figure 28:
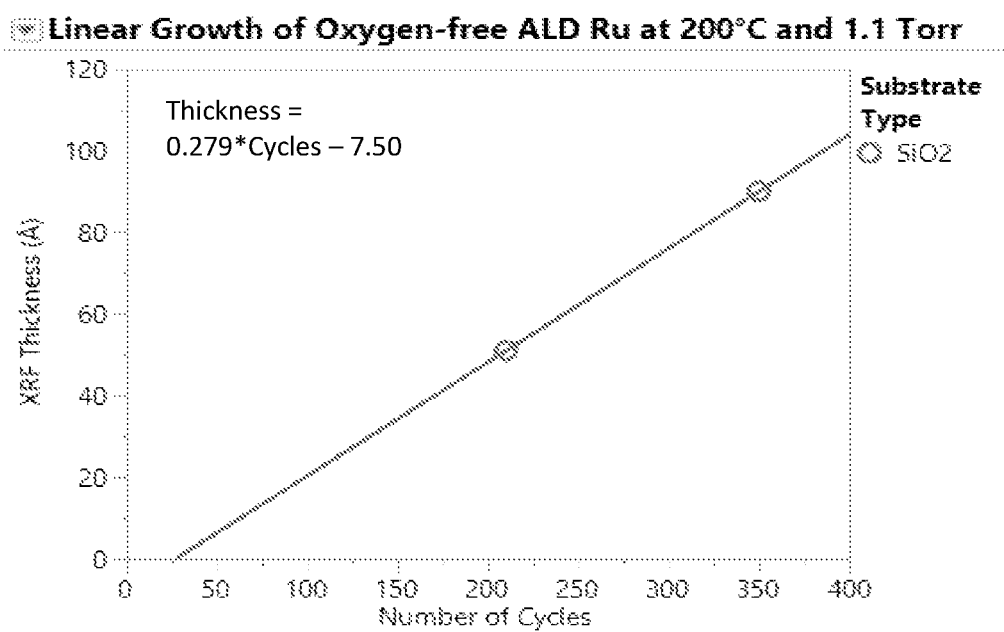
FIG. 28 is a graphical representation of ruthenium film thickness by XRF (Å) vs. number of cycles for oxygen-free ALD of ruthenium using (DMBD)Ru(CO)$_3$ and tBu-hydrazine co-reactant at 200° C.
Figure 29:
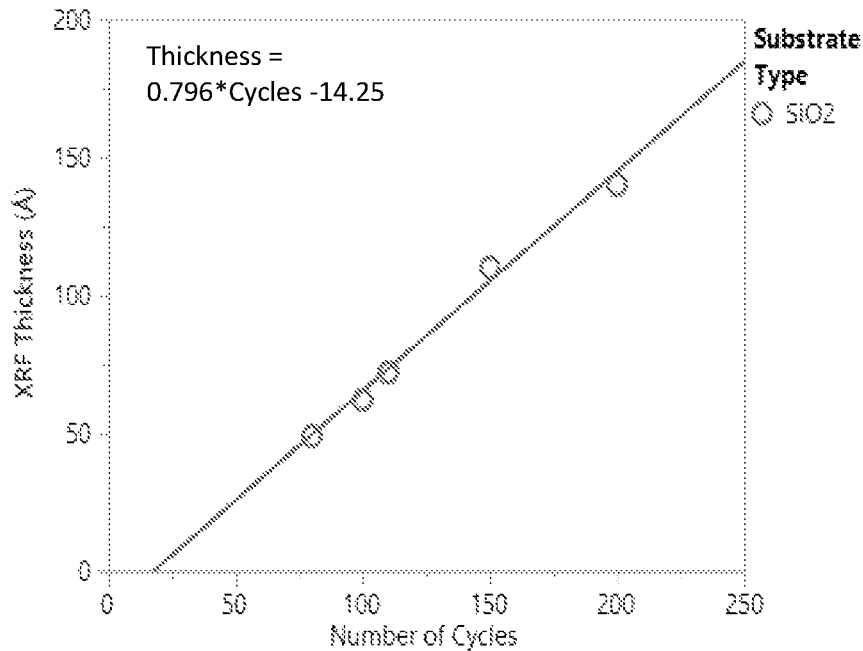
FIG. 29 is a graphical representation of ruthenium film thickness by XRF (Å) vs. number of cycles for oxygen-free ALD of ruthenium using (DMBD)Ru(CO)$_3$ and tBu-hydrazine co-reactant at 225° C.
Figure 30:
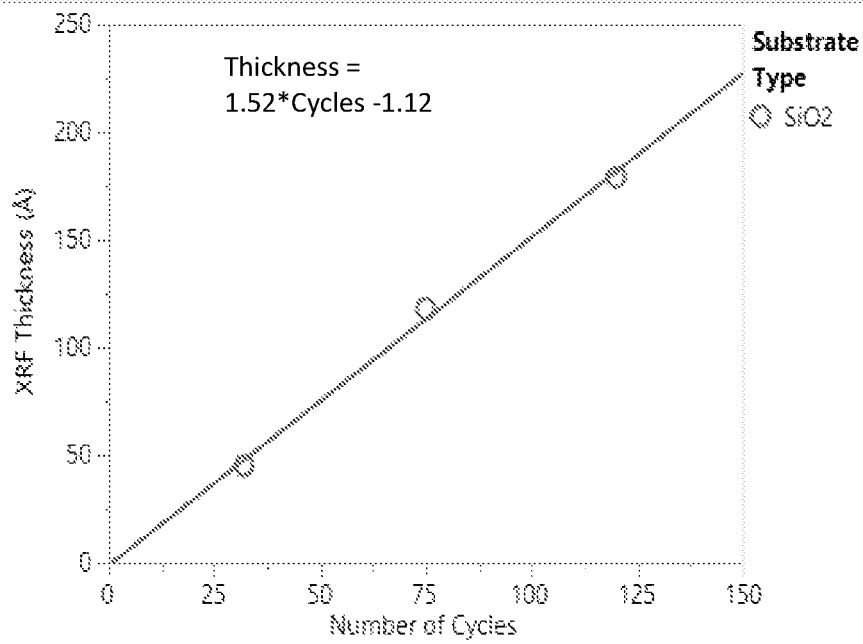
FIG. 30 is a graphical representation of ruthenium film thickness by XRF (Å) vs. number of cycles for oxygen-free ALD of ruthenium using (DMBD)Ru(CO)$_3$ and tBu-hydrazine co-reactant at 250° C.

The same procedure as in Example 14 was carried out on a SiO$_2$ substrate at a deposition temperature of 200° C. for FIG. 28, 225° C. for FIG. 29 and 250° C. for FIG. 30. FIG. 28 demonstrates a nucleation delay of about 27 cycles. FIG. 29 demonstrates a nucleation delay of about 18 cycles. FIG. 30 demonstrates a nucleation delay of about 1 cycle.

As shown in FIGS. 28-30, there was short nucleation delay on SiO$_2$, and nucleation delay decreased with increasing deposition temperature.

Example 16—Comparison of as-Deposited Ru Films Vs. Ru Films Annealed at Various Temperatures with in Ar Following O2-Free ALD Using (DMBD)Ru(CO)$_3$ and tBu-Hydrazine Annealing procedure: a ruthenium film was deposited on three substrates (large coupons), SiO$_2$ (100 nm thick), Al$_2$O$_3$ on SiO$_2$, or WCN on SiO$_2$, at each deposition temperature as described in Example 14 forming "As-Deposited" Ru films. A large coupon was measured and then diced into multiple smaller chips and exposed to air for at least 2 days forming "Before Anneal" Ru films. Each small chip was then individually annealed in Ar at 1.5-1.7 Torr pressure with a gas flow rate of about 150 sccm for 30 minutes at an anneal temperature of 400° C. forming "400 C Ar Annealed" Ru films.

I. Resistivity

Figure 31:
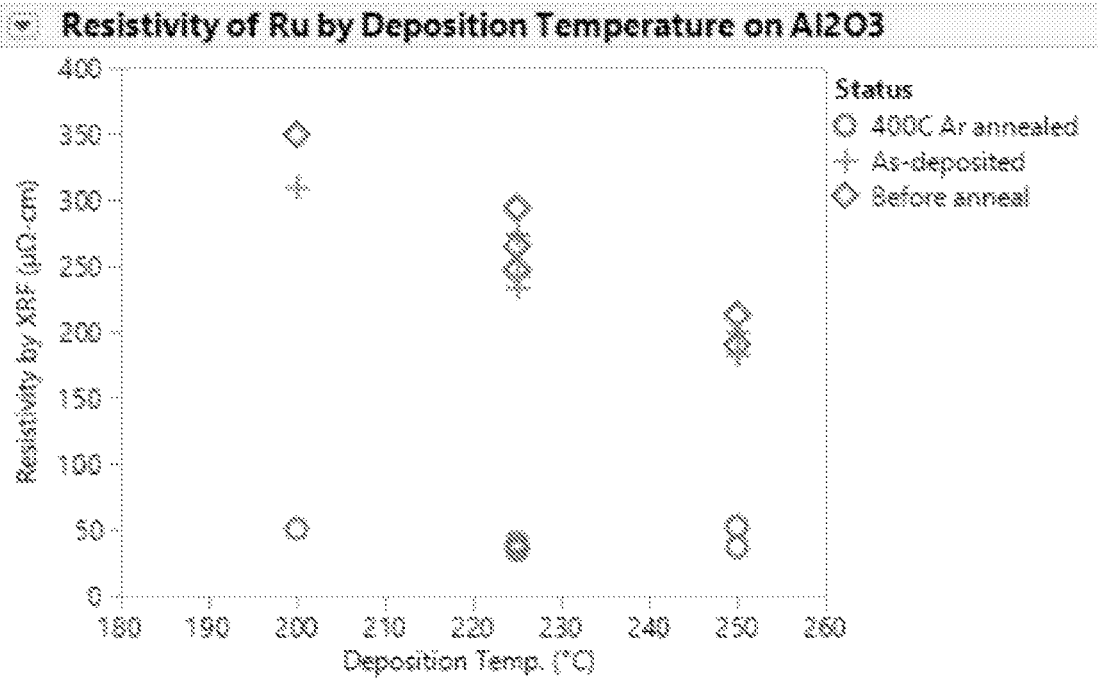
FIG. 31 is a graphical representation of resistivity (μΩ-cm) vs. deposition temperature (° C.) demonstrating the effect of deposition temperature at 200° C., 225° C. and 250° C. and the effect of annealing temperature of 400° C. on resistivity of ruthenium films grown by oxygen-free ALD using (DMBD)Ru(CO)$_3$ and tBu-hydrazine co-reactant on an Al$_2$O$_3$ substrate.
Figure 32:
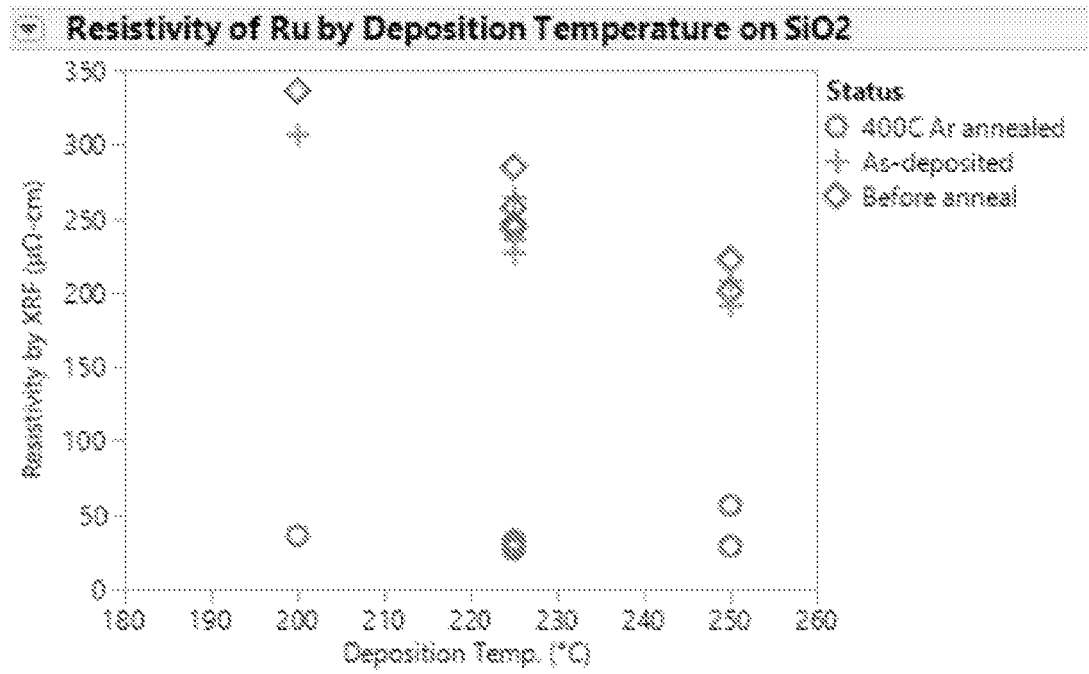
FIG. 32 is a graphical representation of resistivity (μΩ-cm) vs. deposition temperature (° C.) demonstrating the effect of deposition temperature at 200° C., 225° C. and 250° C. and the effect of annealing temperature of 400° C. on resistivity of ruthenium films grown by oxygen-free ALD using (DMBD)Ru(CO)$_3$ and tBu-hydrazine co-reactant on an SiO$_2$ substrate.
Figure 33:
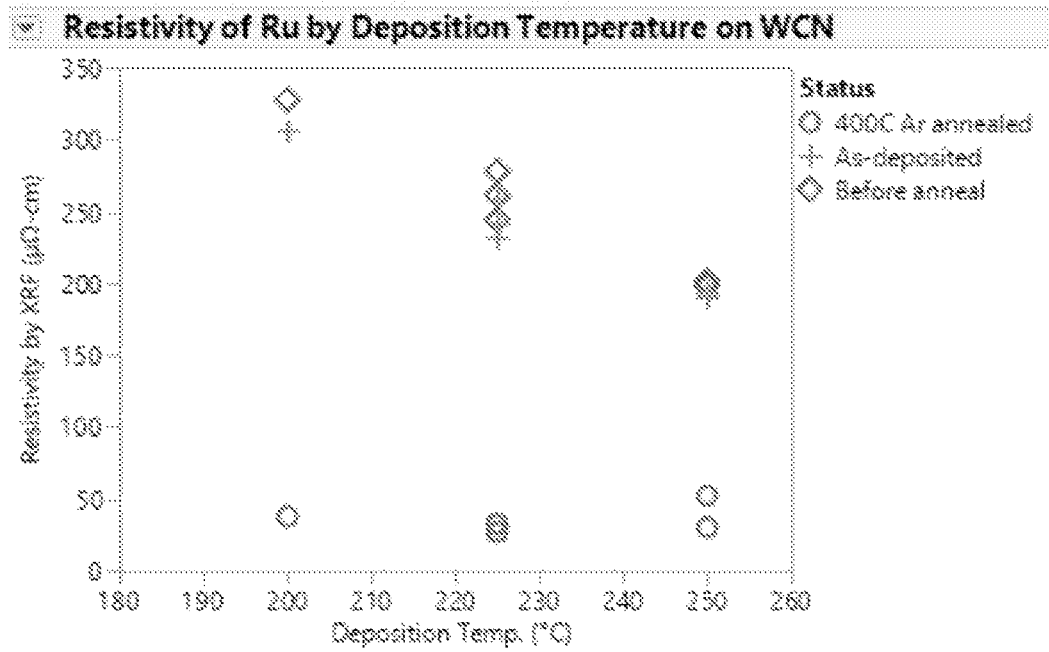
FIG. 33 is a graphical representation of resistivity (μΩ-cm) vs. deposition temperature (° C.) demonstrating the effect of deposition temperature at 200° C., 225° C. and 250° C. and the effect of annealing temperature of 400° C. on resistivity of ruthenium films grown by oxygen-free ALD using (DMBD)Ru(CO)$_3$ and tBu-hydrazine co-reactant on an WCN substrate.

Resistivity was measured for the As-Deposited Ru films, the Before Anneal Ru films, and the 400 C Ar Annealed Ru films. FIG. 31 shows a comparison of As-Deposited Ru films, the Before Anneal Ru films, and the 400 C Ar Annealed Ru films on an Al$_2$O$_3$ substrate at deposition temperatures of 200° C., 225° C., and 250° C. FIG. 32 shows a comparison of As-Deposited Ru films, the Before Anneal Ru films, and the 400 C Ar Annealed Ru films on a SiO$_2$ substrate at deposition temperatures of 200° C., 225° C., and 250° C. FIG. 33 shows a comparison of As-Deposited Ru films, the Before Anneal Ru films, and the 400 C Ar Annealed Ru films on a WCN substrate at deposition temperatures of 200° C., 225° C., and 250° C. As shown in FIGS. 31-33, resistivity increased slightly before annealing after two-day exposure to air, and the 400 C Ar Annealed Ru films had low resistivity on all the substrates.

Figure 34:
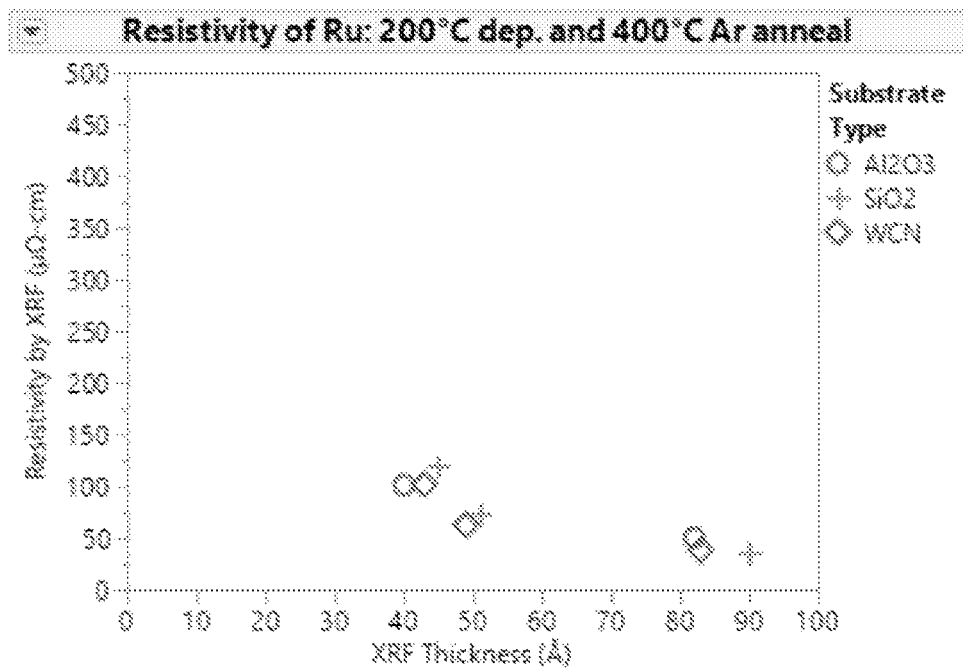
FIG. 34 is a graphical representation of resistivity (μΩ-cm) vs. ruthenium film thickness by XRF (Å) following oxygen-free ALD using (DMBD)Ru(CO)$_3$ and tBu-hydrazine co-reactant at a deposition temperature of 200° C. on a film annealed with Ar at 400° C. on Al$_2$O$_3$, SiO$_2$, and WCN.
Figure 35:
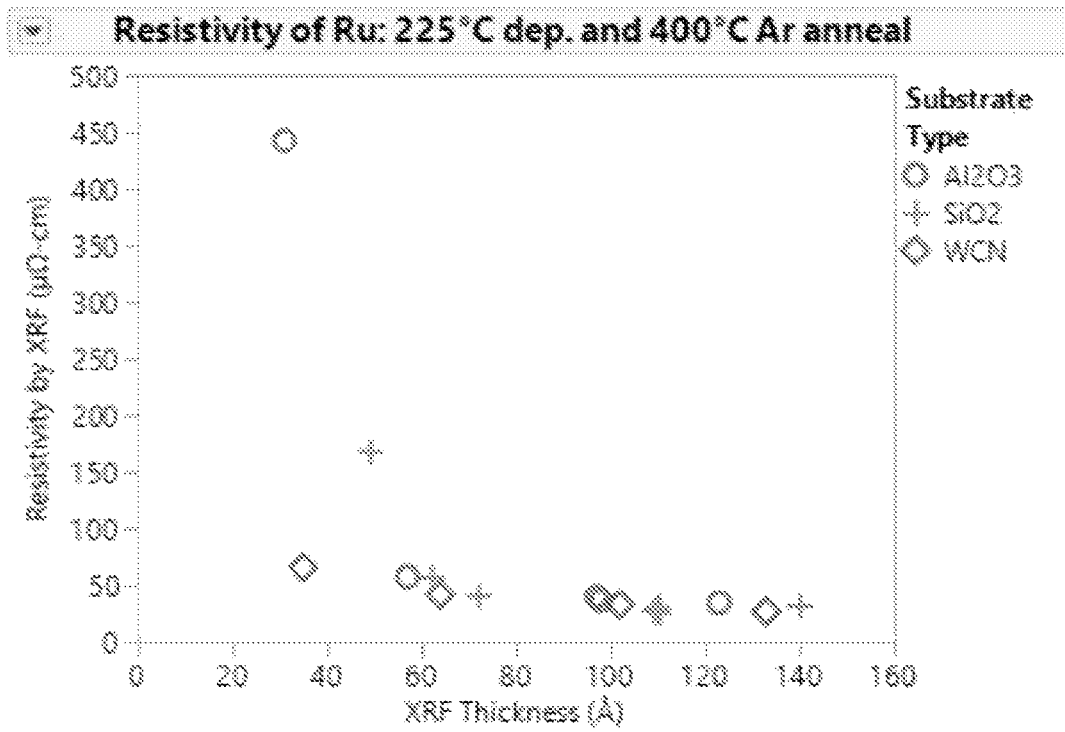
FIG. 35 is a graphical representation of resistivity (μΩ-cm) vs. ruthenium film thickness by XRF (Å) following oxygen-free ALD using (DMBD)Ru(CO)$_3$ and tBu-hydrazine co-reactant at a deposition temperature of 225° C. on a film annealed with Ar at 400° C. on Al$_2$O$_3$, SiO$_2$, and WCN.
Figure 36:
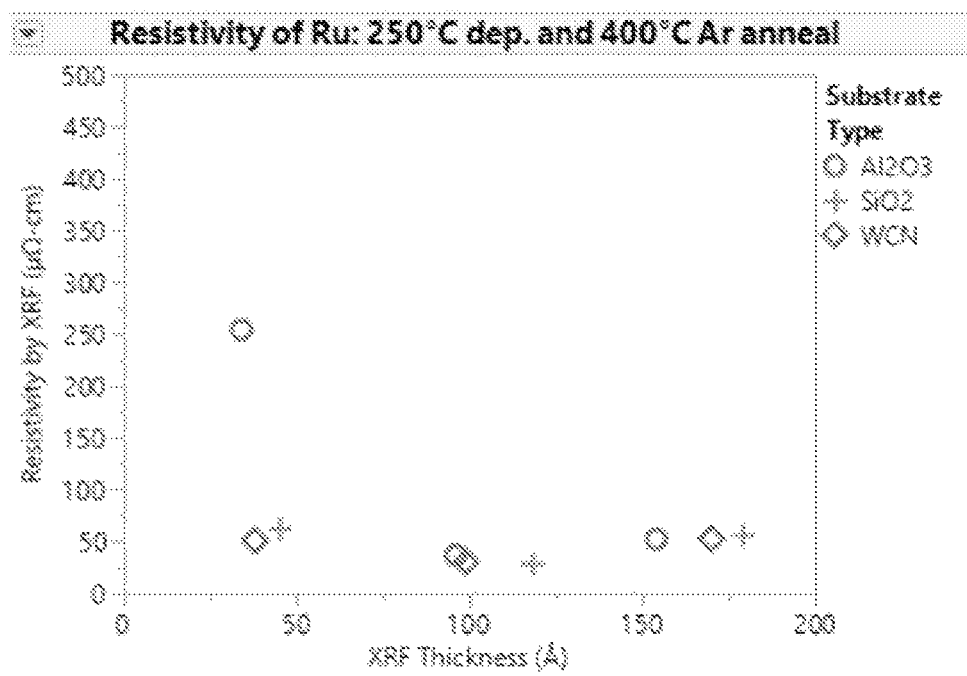
FIG. 36 is a graphical representation of resistivity (μΩ-cm) vs. ruthenium film thickness by XRF (Å) following oxygen-free ALD using (DMBD)Ru(CO)$_3$ and tBu-hydrazine co-reactant at a deposition temperature of 250° C. on a film annealed with Ar at 400° C. on Al$_2$O$_3$, SiO$_2$, and WCN.

FIGS. 34, 35, and 36 demonstrate film thickness dependence of resistivity for 400 C Ar Annealed Ru films on SiO$_2$, Al$_2$O$_3$, and WCN substrates at deposition temperatures of 200° C., 225° C., and 250° C., respectively.

II. Loss of Nitrogen

Figure 37A:
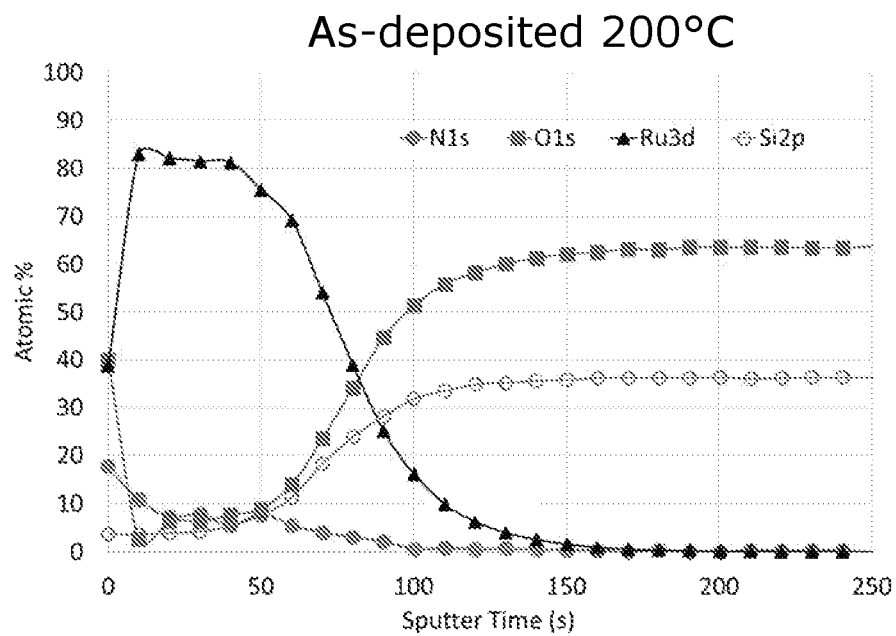
FIGS. 37A, 37B, and 37C are graphical representations of atomic % vs. sputter time (s.) as determined by XPS for as-deposited ruthenium films on SiO$_2$ substrates formed from oxygen-free ALD using (DMBD)Ru(CO)$_3$ and tBu-hydrazine co-reactant at deposition temperatures of 200° C., 225° C., and 250° C., respectively.
Figure 37B:
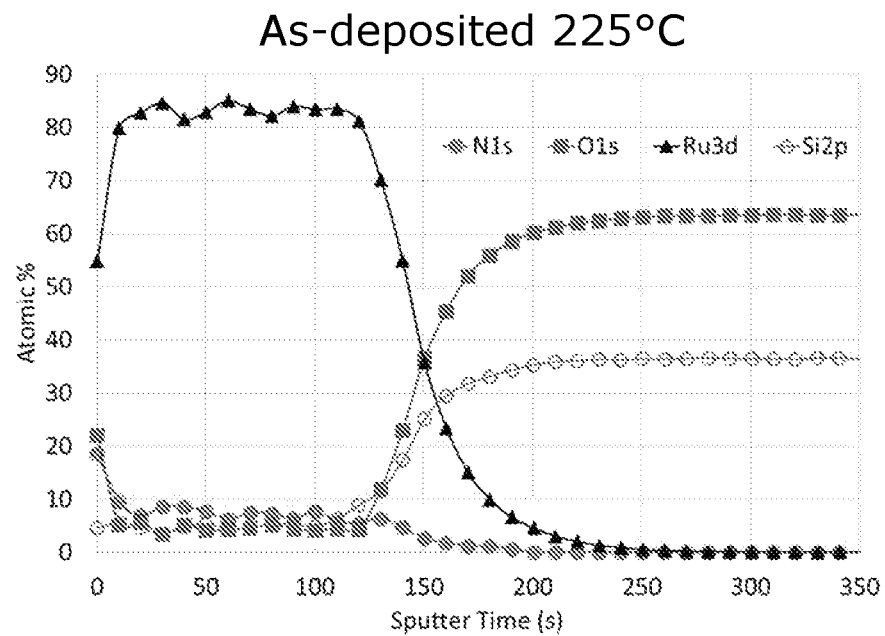
Figure 37C:
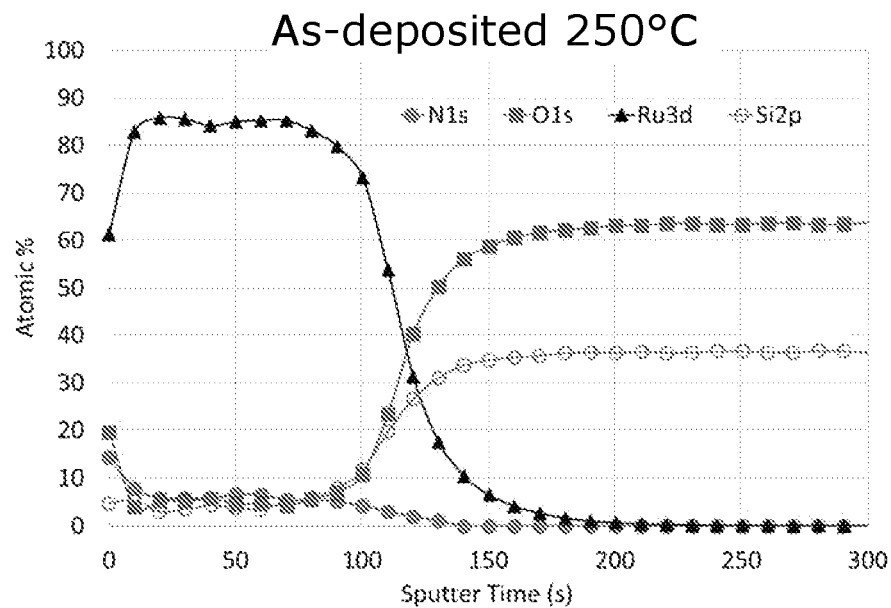

XPS analysis was performed on the As-Deposited Ru films and the 400 C Ar Annealed Ru films on the SiO$_2$ substrate at deposition temperatures of 200° C., 225° C., and 250° C. FIGS. 37A-37C demonstrate the existence of 6-8 at % N and very low level of O in As-Deposited Ru films from the tBu-hydrazine co-reactant at deposition temperatures of 200° C., 225° C., and 250° C., respectively.

Figure 38A:
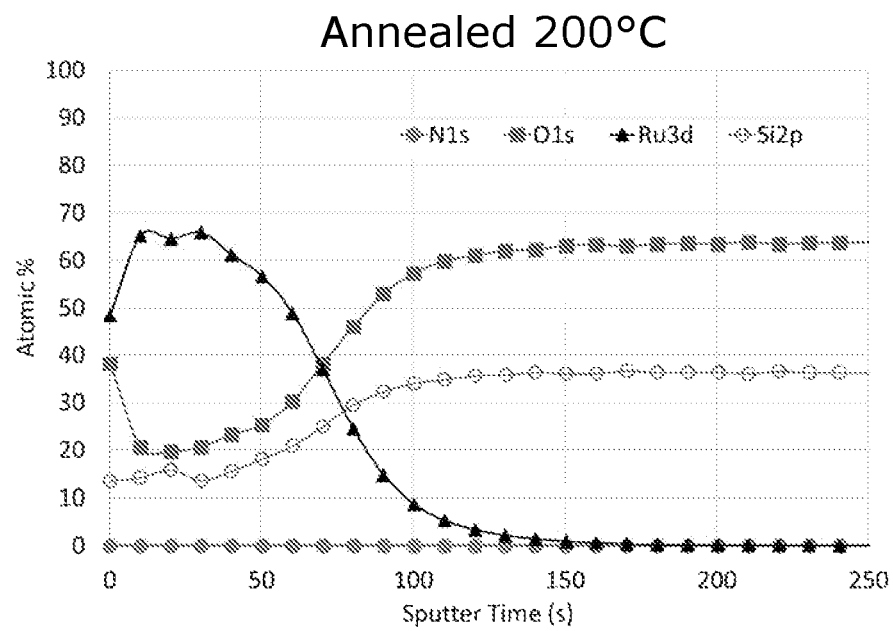
FIGS. 38A, 38B, and 38C are graphical representations of atomic % vs. sputter time (s.) as determined by XPS for as-deposited ruthenium films on SiO$_2$ substrates formed from oxygen-free ALD using (DMBD)Ru(CO)$_3$ and tBu-hydrazine co-reactant at deposition temperatures of 200° C., 225° C., and 250° C., respectively, followed by annealing in Ar at 400° C.
Figure 38B:
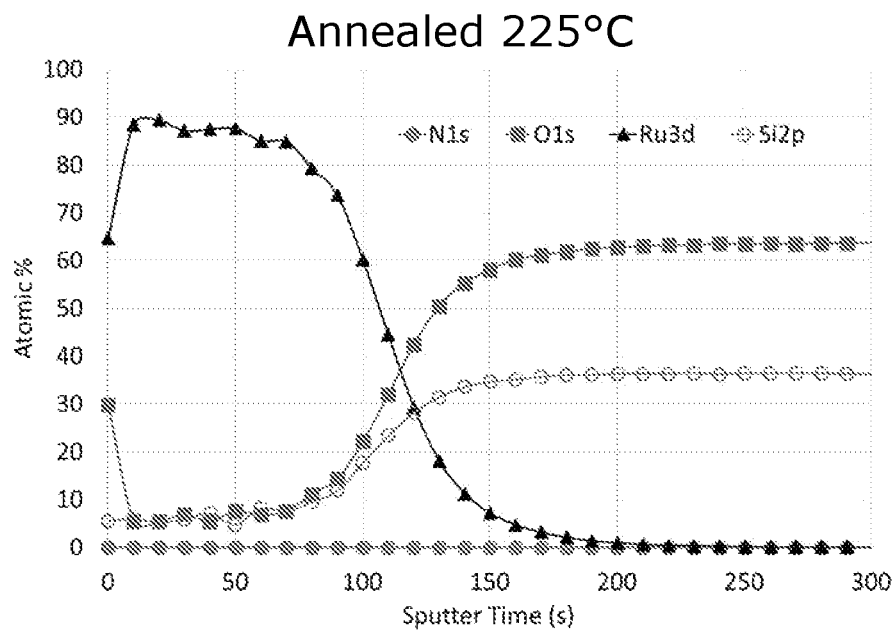
Figure 38C:
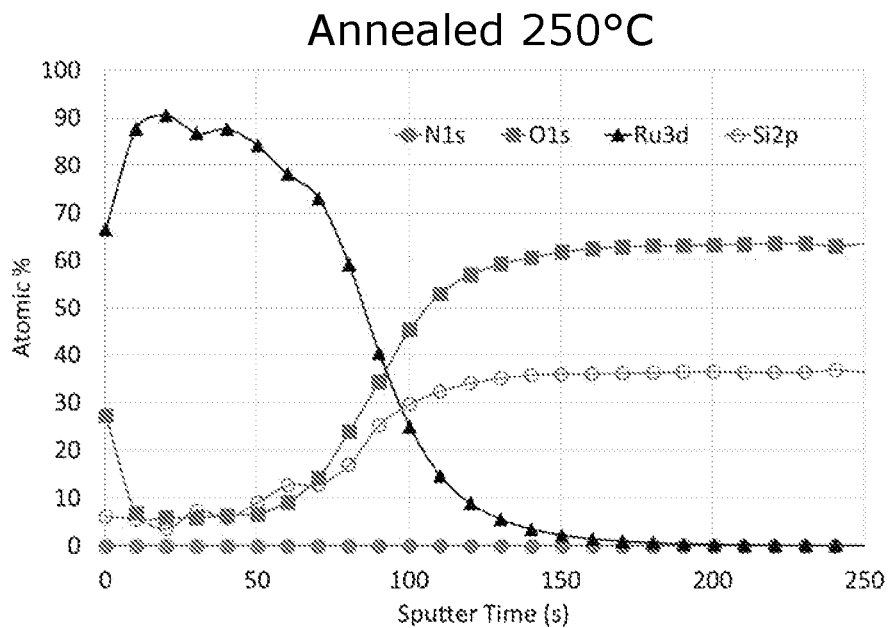

FIGS. 38A-38C demonstrates complete loss of nitrogen upon annealing in Ar at 400° C. for the 400 C Ar Annealed Ru films from the tBu-hydrazine co-reactant at deposition temperatures of 200° C., 225° C., and 250° C., respectively.

III. Film Surface

Top down view SEM images of the As-Deposited Ru films and corresponding 400 C Ar Annealed Ru films on an Al$_2$O$_3$ substrate and a WCN substrate at deposition temperatures of 200° C., 225° C., and 250° C. were taken.

Figure 39A:
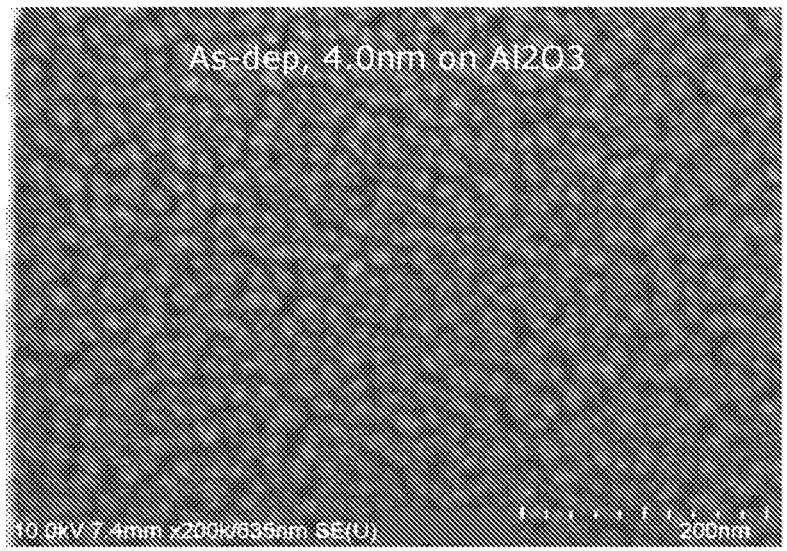
FIG. 39A is an SEM image top view of a 4.0 nm thick As-Deposited Ru film on Al$_2$O$_3$ at a deposition temperature of 200° C.
Figure 39B:
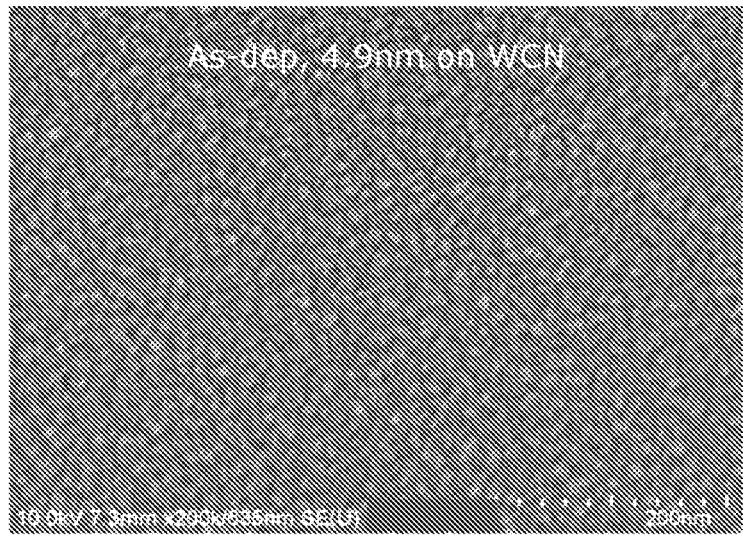
FIG. 39B is an SEM image top view of a 4.9 nm thick As-Deposited Ru film on WCN at a deposition temperature of 200° C.

FIG. 39A shows an SEM image of a 4.0 nm thick As-Deposited Ru film on Al$_2$O$_3$ at a deposition temperature of 200° C. FIG. 39B shows an SEM image of a 4.9 nm thick As-Deposited Ru film on WCN at a deposition temperature of 200° C. FIGS. 39A and 39B demonstrate a film with smaller grains on the WCN substrate.

Figure 40A:
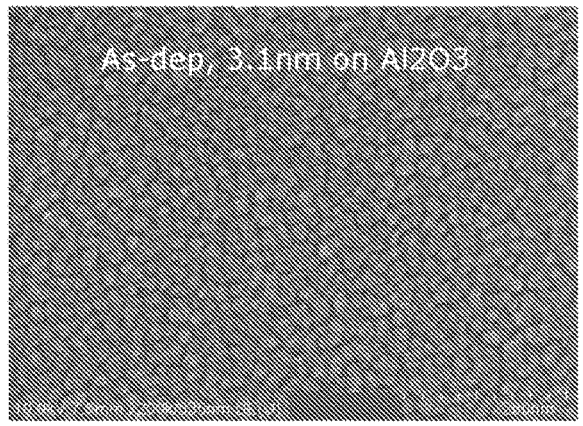
FIG. 40A is an SEM image top view of a 3.1 nm thick As-Deposited Ru film on Al$_2$O$_3$.
Figure 40B:
FIG. 40B is an SEM image top view of a 3.5 nm thick As-Deposited Ru film on WCN.
Figure 40C:
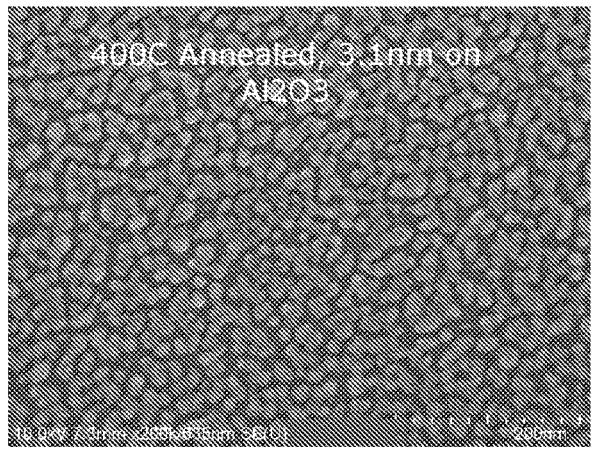
FIG. 40C is an SEM image top view of a 3.1 nm thick 400 C Ar Annealed Ru film on Al$_2$O$_3$.
Figure 40D:
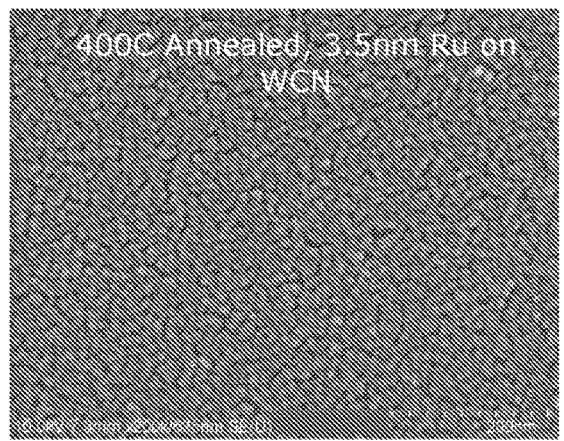
FIG. 40D is an SEM image top view of a 3.5 nm thick 400 C Ar Annealed Ru film on WCN.

FIG. 40A shows an SEM image of a 3.1 nm thick As-Deposited Ru film on Al$_2$O$_3$. FIG. 40B shows an SEM image of a 3.5 nm thick As-Deposited Ru film on WCN. FIG. 40C shows an SEM image of the 3.1 nm thick 400 C Ar Annealed Ru film on Al$_2$O$_3$. FIG. 40D shows an SEM image of the 3.5 nm thick 400 C Ar Annealed Ru film on WCN. FIGS. 40A-40D demonstrate films with smaller grains on the WCN substrate and rougher annealed films with voids on the Al$_2$O$_3$ substrate. The films in FIGS. 40A-40D were deposited at a deposition temperature of 225° C.

Figure 41A:
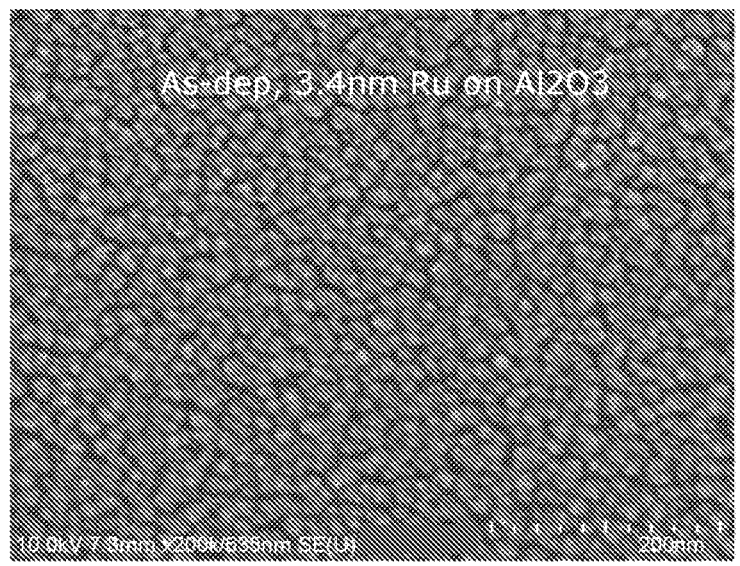
FIG. 41A is an SEM image top view of a 3.4 nm thick As-Deposited Ru film on Al$_2$O$_3$ at a deposition temperature of 250° C.
Figure 41B:
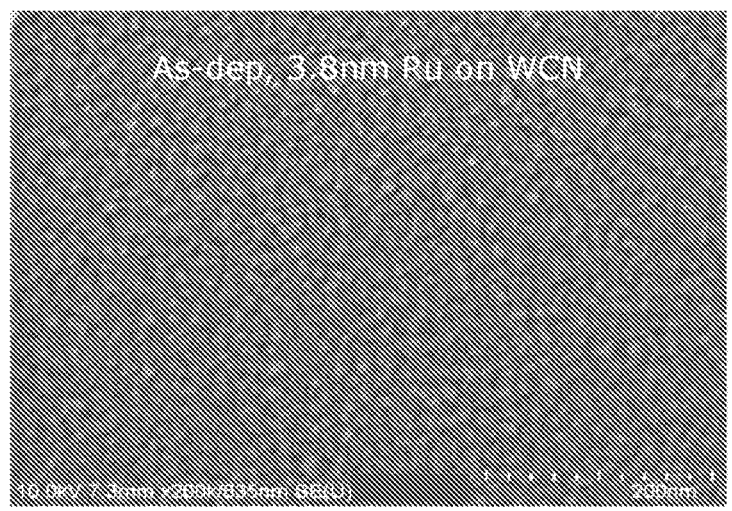
FIG. 41B is an SEM image top view of a 4.9 nm thick As-Deposited Ru film on WCN at a deposition temperature of 250° C.

FIG. 41A shows an SEM image of a 3.4 nm thick As-Deposited Ru film on Al$_2$O$_3$ at a deposition temperature of 250° C. FIG. 41B shows an SEM image of a 4.9 nm thick As-Deposited Ru film on WCN at a deposition temperature of 250° C. FIGS. 41A and 41B demonstrate a film with smaller grains on the WCN substrate.

Figure 42:
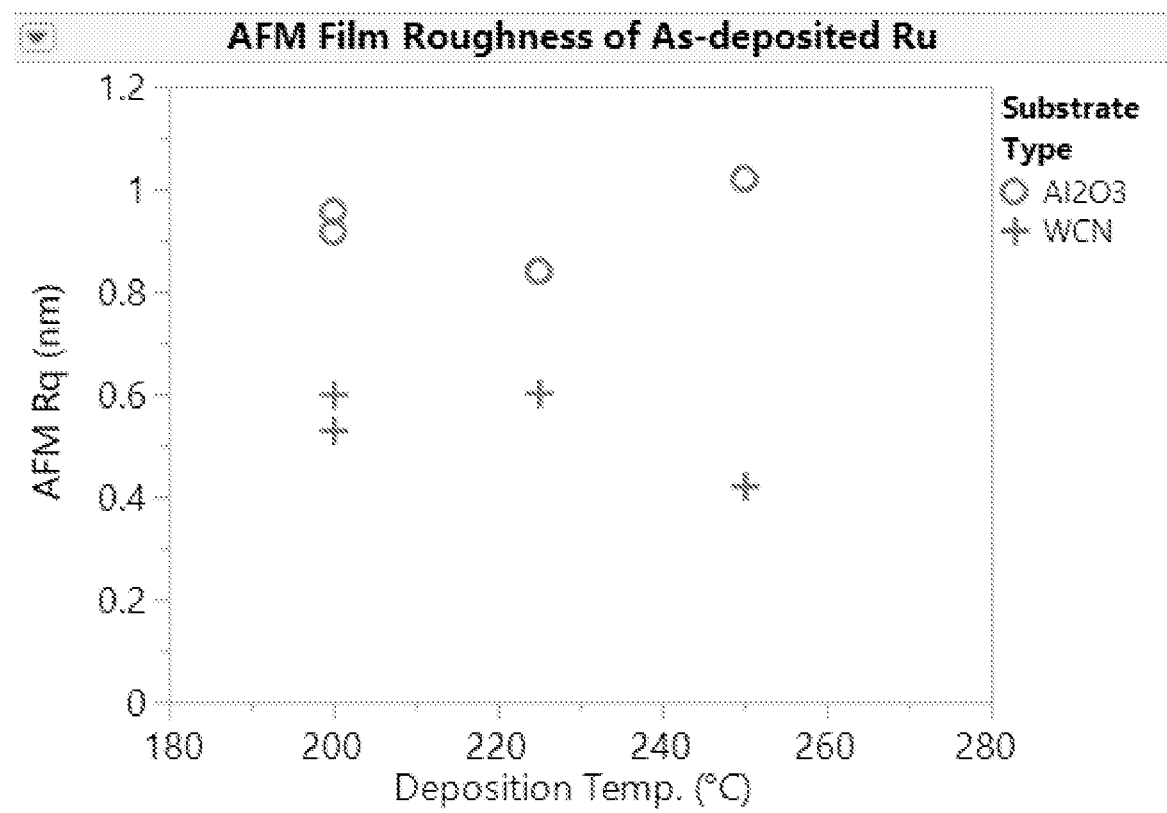
FIG. 42 is a graphical representation of film roughness vs. deposition temperature (° C.) as measured by atomic force microscopy (AFM) for As-Deposited Ru films on a WCN substrate and on an Al$_2$O$_3$ substrate.

FIG. 42 demonstrates lower film roughness as measured by atomic force microscopy (AFM) for As-Deposited Ru films on a WCN substrate compared to As-Deposited Ru films on a Al$_2$O$_3$ substrate at deposition temperatures of 200° C., 225° C., and 250° C.

All publications, patent applications, issued patents and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The words "comprise", "comprises", and "comprising" are to be interpreted inclusively rather than exclusively.

What is claimed is:

1. A method of forming a ruthenium-containing film by atomic layer deposition (ALD) or a combination of ALD and chemical vapor deposition (CVD), the method comprising,
performing one or more cycles to form the ruthenium-containing film, wherein each cycle comprises delivering at least one precursor followed by a purge gas and an oxygen-free co-reactant followed by the purge gas to a substrate to form the ruthenium-containing film, wherein the oxygen-free co-reactant is selected from the group consisting of NH$_3$, hydrazine, and an alkyl-hydrazine and wherein the at least one precursor corresponds in structure to Formula I:

(L)Ru(CO)$_3$ (Formula I)

wherein L is selected from the group consisting of a linear or branched C$_2$-C$_6$-alkenyl and a linear or branched C$_1$-C$_6$-alkyl; and wherein L is optionally substituted with one or more substituents independently selected from the group consisting of $C_2$-$C_6$-alkenyl, $C_1$-$C_6$-alkyl, alkoxy and $NR^1R^2$; wherein $R^1$ and $R^2$ are independently alkyl or hydrogen; and after completing the delivering of the at least one precursor followed by the purge gas and the oxygen-free co-reactant followed by the purge gas of the final cycle, annealing the ruthenium-containing film under vacuum or in the presence of an inert gas or a reducing gas or a combination thereof, wherein the annealing is performed for at least about 30 minutes and at about 300° C. to about 500° C. and the annealing removes nitrogen from the ruthenium-containing film, wherein the annealed ruthenium-containing film comprises substantially no nitrogen.

2. The method of claim 1, wherein the inert gas comprises Ar or $N_2$, and the reducing gas comprises $H_2$.

3. The method of claim 1, wherein the substrate temperature is from about 150° C. to about 350° C.

4. The method of claim 1, wherein the ruthenium-containing film has one or more of (i) a resistivity of about 10 μΩ-cm to about 80 μΩ-cm; and (ii) a thickness of about 1 nm to about 20 nm.

5. The method of claim 1, wherein the ruthenium-containing film is conformally deposited.

6. The method of claim 1, wherein L is a linear or branched dienyl-containing moiety, and wherein L is optionally substituted with one or more substituents independently selected from the group consisting of $C_2$-$C_6$-alkenyl, $C_1$-$C_6$-alkyl, alkoxy and $NR^1R^2$; and $R^1$ and $R^2$ are independently alkyl or hydrogen.

7. The method of claim 1, wherein L is a linear or branched dienyl-containing moiety selected from the group consisting of butadienyl, pentadienyl, hexadienyl, heptadienyl and octadienyl.

8. The method of claim 1, wherein the at least one precursor is selected from the group consisting of:
($\eta^4$-buta-1,3-diene)tricarbonylruthenium;
($\eta^4$-2,3-dimethylbuta-1,3-diene)tricarbonylruthenium; and
($\eta^4$-2-methylbuta-1,3-diene)tricarbonylruthenium.

9. The method of claim 1, wherein the substrate is selected from the group consisting of silicon, silicon oxide, silicon nitride, tantalum, tantalum nitride, titanium nitride, aluminum oxide, copper, tungsten carbonitride, and a combination thereof.

10. The method of claim 1, wherein the annealing is performed at about 500° C.

11. A method of forming a ruthenium-containing film by CVD, the method comprising,
performing one or more cycles to form the ruthenium-containing film, wherein each cycle comprises delivering at least one precursor followed by a purge gas and a non-oxygen co-reactant selected from the group consisting of hydrazine and alkylhydrazine followed by the purge gas to a substrate to form the ruthenium-containing film, wherein the at least one precursor corresponds in structure to Formula I:

$$(L)Ru(CO)_3 \quad \text{(Formula I)}$$

wherein L is selected from the group consisting of a linear or branched $C_2$-$C_6$-alkenyl and a linear or branched $C_1$-$C_6$-alkyl; and wherein L is optionally substituted with one or more substituents independently selected from the group consisting of $C_2$-$C_6$-alkenyl, $C_1$-$C_6$-alkyl, alkoxy and $NR^1R^2$; wherein $R^1$ and $R^2$ are independently alkyl or hydrogen; and after completing the delivering of the at least one precursor followed by the purge gas and the oxygen-free co-reactant followed by the purge gas of the final cycle, annealing the ruthenium-containing film under vacuum or in the presence of an inert gas or a reducing gas or a combination thereof, wherein the annealing is performed for at least about 30 minutes and at about 300° C. to about 500° C. and the annealing removes nitrogen from the ruthenium-containing film, wherein the annealed ruthenium-containing film comprises substantially no nitrogen.

12. The method of claim 11, wherein the inert gas comprises Ar or $N_2$, and the reducing gas comprises $H_2$.

13. The method of claim 11, wherein the substrate temperature is from about 150° C. to about 350° C.

14. The method of claim 11, wherein the ruthenium-containing film has one or more of (i) a resistivity of about 10μχ-cm to about 80 μΩ-cm; and (ii) a thickness of about 1 nm to about 20 nm.

15. The method of claim 11, wherein the ruthenium-containing film is conformally deposited.

16. The method of claim 11, wherein L is a linear or branched dienyl-containing moiety, and wherein L is optionally substituted with one or more substituents independently selected from the group consisting of $C_2$-$C_6$-alkenyl, $C_1$-$C_6$-alkyl, alkoxy and $NR^1R^2$; and $R^1$ and $R^2$ are independently alkyl or hydrogen.

17. The method of claim 11, wherein L is a linear or branched dienyl-containing moiety selected from the group consisting of butadienyl, pentadienyl, hexadienyl, heptadienyl and octadienyl.

18. The method of claim 11, wherein the at least one precursor is selected from the group consisting of:
($\eta^4$-buta-1,3-diene)tricarbonylruthenium;
($\eta^4$-2,3-dimethylbuta-1,3-diene)tricarbonylruthenium; and
($\eta^4$-2-methylbuta-1,3-diene)tricarbonylruthenium.

19. The method of claim 11, wherein the substrate is selected from the group consisting of silicon, silicon oxide, silicon nitride, tantalum, tantalum nitride, titanium nitride, aluminum oxide, copper, tungsten carbonitride, and a combination thereof.

20. The method of claim 11, wherein the annealing is performed at about 350° C. to about 500° C.

21. A method of lowering the resistivity of a ruthenium-containing film, the method comprising: annealing the ruthenium-containing film in the presence of an inert gas for at least about 30 minutes and at a temperature between about 300° C.-400° C. to remove nitrogen from the ruthenium-containing film and to form an annealed ruthenium-containing film having a resistivity at least about 10% less than the ruthenium-containing film, wherein the ruthenium-containing film is formed from ALD comprising delivering one or more of:
($\eta^4$-buta-1,3-diene)tricarbonylruthenium,
($\eta^4$-2,3-dimethylbuta-1,3-diene)tricarbonylruthenium, and
($\eta^4$-2-methylbuta-1,3-diene)tricarbonylruthenium,
followed by a purge gas and an oxygen-free co-reactant followed by the purge gas to a substrate, wherein the oxygen-free co-reactant is selected from the group consisting of $NH_3$, hydrazine, and an alkylhydrazine wherein the annealed ruthenium-containing film comprises substantially no nitrogen.

22. The method of claim 21, wherein the inert gas comprises Ar or $N_2$.

23. The method of claim 21, wherein the annealing is performed at about 350° C. to about 400° C.

* * * * *